United States Patent
Tanaka et al.

(10) Patent No.: US 6,797,526 B2
(45) Date of Patent: Sep. 28, 2004

(54) METHOD FOR MANUFACTURING SEMICONDUCTOR DEVICES AND METHOD AND ITS APPARATUS FOR PROCESSING DETECTED DEFECT DATA

(75) Inventors: Maki Tanaka, Tokyo (JP); Shunji Maeda, Tokyo (JP); Minori Noguchi, Tokyo (JP); Takafumi Okabe, Tokyo (JP); Yuji Takagi, Tokyo (JP); Chie Shishido, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 196 days.

(21) Appl. No.: 10/232,871

(22) Filed: Aug. 30, 2002

(65) Prior Publication Data

US 2003/0054573 A1 Mar. 20, 2003

(30) Foreign Application Priority Data

Sep. 20, 2001 (JP) ...................................... 2001-287779

(51) Int. Cl.[7] .............................................. H01L 21/00
(52) U.S. Cl. ........................................................... 438/5
(58) Field of Search ...................... 438/5, 8, 14; 702/35, 702/81, 83, 84, 110, 117, 118

(56) References Cited

U.S. PATENT DOCUMENTS 5,991,699 A 11/1999 Kulkarni et al.
6,542,830 B1 * 4/2003 Mizuno et al. ................ 702/35

FOREIGN PATENT DOCUMENTS

| JP | 11-045919 | 2/1999 |
|----|-----------|--------|
| JP | 11-354396 | 12/1999 |

* cited by examiner

Primary Examiner—David A. Zarneke
Assistant Examiner—Monica D. Harrison
(74) Attorney, Agent, or Firm—Townsend and Townsend and Crew LLP

(57) ABSTRACT

Disclosed herein is a method for manufacturing semiconductor device and a method and apparatus for processing detected defect data, making it possible to quickly infer or determine a process and related manufacturing equipment that causes defects in a fabrication line of semiconductor devices, take remedy action, and achieve a constant and high yield. The method of the invention comprises quantitatively evaluating similarity of a defects distribution on a wafer that suffered abnormal occurrence of defects to inspection results for wafers inspected in the past, analyzing cyclicity of data sequence of evaluated similarity, evaluating relationship between the cyclicity of defects obtained from the analysis and the process method according to each manufacturing equipment in the fabrication line, and inferring or determining a causal process and equipment that caused the defects.

12 Claims, 20 Drawing Sheets

Abnormal Occurrence of Defects on a Wafer D1

Degree of Matching

R1 High

R2 Low

R3 High

Rn Low

FIG.11
(a)
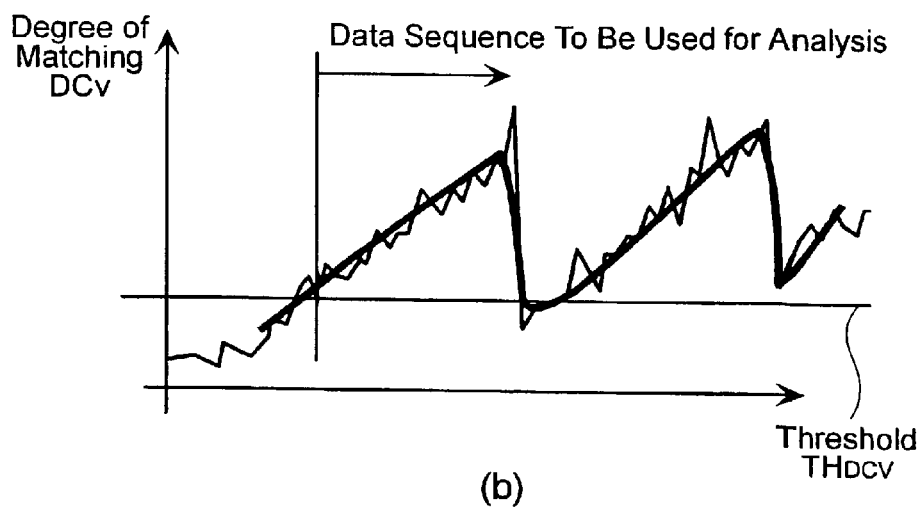
(b)
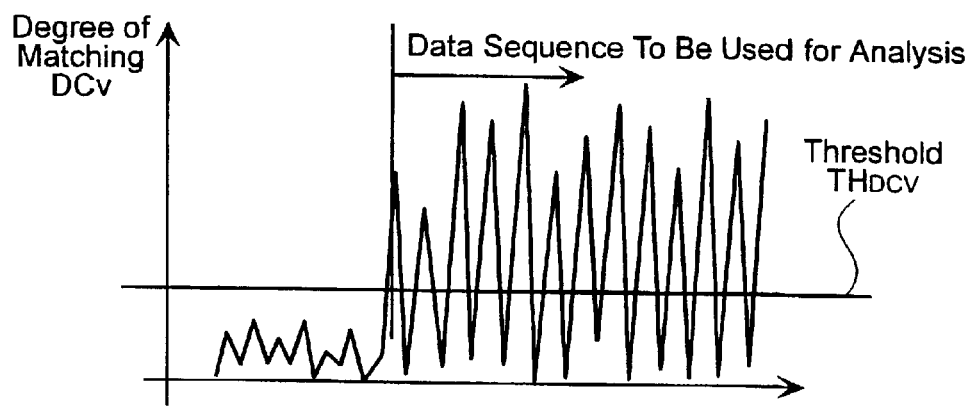
(c)
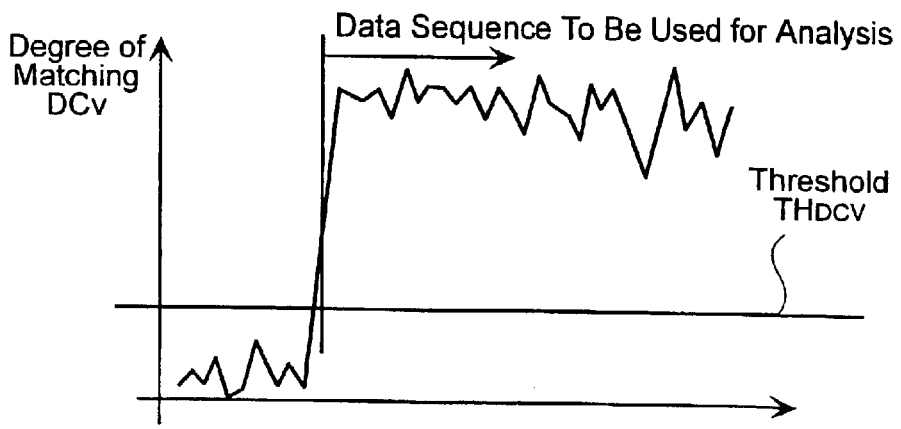

FIG.14

| Sub-process | Manufacturing Equipment Name | Process Cycle | Number of Wafers To Be Processed at a Time | Maintenance Record |
|---|---|---|---|---|
| CVD | xxx-1 | 2 | 25 | MM/DD Cleaning ... MM/DD Part Replacement |
| CVD | xxx-2 | 2 | 25 | MM/DD Cleaning ... MM/DD Cleaning |
| CVD | yyy-1 | 1 | 25 | MM/DD Cleaning ... MM/DD Cleaning |
| ⋮ | ⋮ | ⋮ | ⋮ | ⋮ |
| Oxidation | zzz-1 | 100 | 100 | MM/DD Part Replacement ... MM/DD Cleaning |

35

FIG.15
Cluster 151 (a)  (b)  (c)
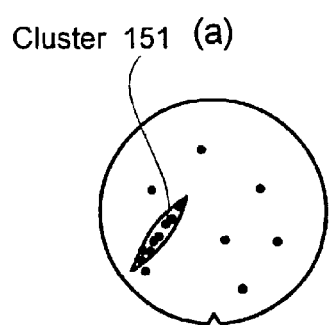 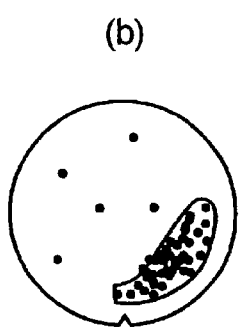 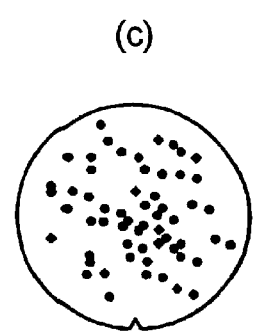
(d)  (e)
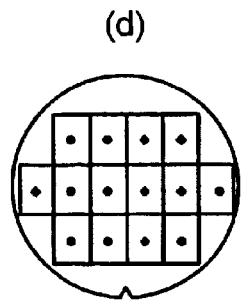 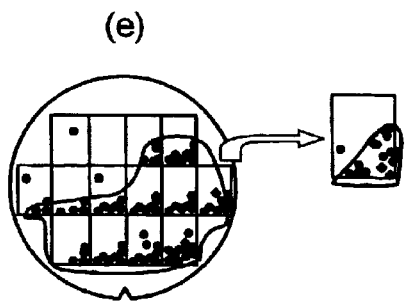
(f)
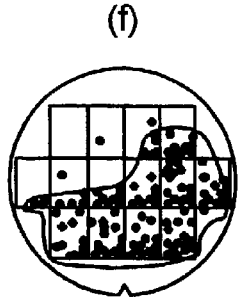

FIG. 18
(a)
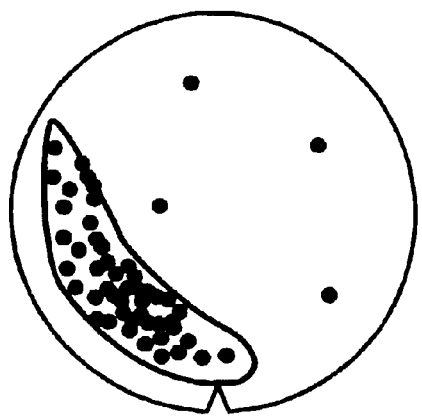
(b)
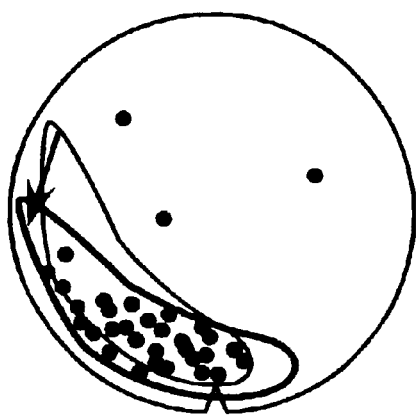
(c)
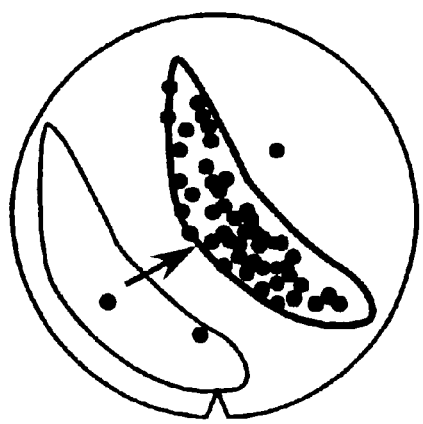

METHOD FOR MANUFACTURING SEMICONDUCTOR DEVICES AND METHOD AND ITS APPARATUS FOR PROCESSING DETECTED DEFECT DATA

BACKGROUND OF THE INVENTION

The present invention relates to a method for processing detected defect data obtained by inspecting semiconductor substrates processed until a predetermined fabrication sub-process, with an inspection equipment or a review station, for defects or suspected defects occurred to the semiconductor substrates, in a fabrication line consisting of a plurality of fabrication sub-processes arranged in sequence, each sub-process being performed by one or a plurality of manufacturing equipments. In particular, the invention relates to a method for manufacturing semiconductor devices, while controlling fault occurrence in the sub-processes in the fabrication line.

As is shown in FIG. 1, a semiconductor device manufacturing process consists of a great number of pattern-forming processes that are iteration. Each pattern-forming process (major process) is comprised of the processes (sub-processes) of thin-film deposition, resist application, expose resist, develop resist, etching, remove resist, and cleaning. Unless the manufacturing conditions are optimized in all the above processes, circuit patterns of a semiconductor device are not formed properly and cracks or deformation may take place in the patterns, which results in wafers that are not acceptable as products.

After being fabricated on a wafer, semiconductor devices are electrically inspected. If defects are detected, examination is made to ascertain what caused them by an appropriate method such as a failure bitmap analysis and remedy action is taken. For example, a known method is described in JP-A No. 354396/1999 that statistically analyzes the relation between the electrical characteristics of the completed device and processing equipments, and determines what equipment caused the defect.

However, the problem with this method is that, even if defects have occurred in the course of the fabrication process, the defects cannot be detected until the fabrication of the wafer is completed. Thus, it may happen that a great quantity of defective products are made before appropriate action against the defects is taken.

To address this problem, the following method has widely been used. As shown in FIG. 1, semiconductor wafers in process of fabrication are inspected for critical dimensions, patterns, and particles on the surface of a wafer, the cause of defects that may occur due to failure or malfunction of an equipment is investigated, and remedy action is taken against it. However, the addition of such inspection processes becomes obstructive to shortening the manufacturing time and therefore it is impossible to inspect all products in all processes. Accordingly, in the practical fabrication line of semiconductor devices, such a method is taken that inspection applies only to critical processes or that wafers to be inspected are sampled at a rate, for example, one for several lots.

Because all manufacturing processes shown in FIG. 1 are possible to be the source of defects, an important technical issue has focused on how to determine a particular process and equipment that caused defects, using the result data from inspection for a small number of wafers.

JP-A No. 455919/1999 discloses a known method of inferring a process that caused defects from defects distribution data obtained by the inspection of wafers in process of fabrication. The problem with this method is that it is difficult to determine a particular process and equipment as the source of defects in the critical processes for which the inspection was not performed.

It is also known that defects having the same causal relationship are similar in their spatial properties and, from this fact, spatial clustering of defects is performed correctly, according to the specification and its accompanying drawings of U.S. Pat. No. 5,991,699.

From the analysis of inspection result data, using the above prior techniques, a sub-process or manufacturing equipment that caused defects can be inferred to some degree. However, it is very difficult to pinpoint a particular sub-process as the source of the defects because semiconductor devices are manufactured through quite a great number of manufacturing processes and there are many sub-processes between a process under inspection and the next process under inspection.

If a plurality of defects resulting from different causes occur, coexisting on a wafer, these defects are interactive and make analysis complex and it often takes considerable time to investigate the cause of the defects.

The previous data analysis methods are all unable to predict where defects would be likely to occur.

SUMMARY OF THE INVENTION

The present invention provides a method for manufacturing semiconductor devices and a method and apparatus for processing detected defect data, thereby making the following possible: for various types of defects that occur to semiconductor substrates during a fabrication line for manufacturing semiconductor devices, early inferring or determining a particular sub-process and related manufacturing equipment as the source of the defects and taking remedy action against the detects at an early stage.

According to one aspect of the invention, a method for manufacturing semiconductor devices is provided. The method comprises: an inspection step of inspecting semiconductor substrates processed until a predetermined sub-process for defects or suspected defects occurred to the semiconductor substrates with an inspection equipment in a fabrication line consisting of a plurality of sub-processes arranged in sequence, each sub-process being performed by one or a plurality of manufacturing equipments; and a step of collecting and analyzing inspection results. The step of collecting and analyzing inspection results comprises: a step of generating a defects distribution on a semiconductor substrate in order to investigate the cause of the defects, based on the inspection results obtained from the inspection step; a step of quantitatively evaluating defect features of the defects distribution on a semiconductor substrate generated by the step of generating a defects distribution; a step of generating data of the defect features quantitatively evaluated by the step of quantitatively evaluating defect features for the manufacturing equipments that processed the semiconductor substrates and the sub-processes that applied to the semiconductor substrates; and a causation inferring step of evaluating cyclicity of the defect features data for the manufacturing equipments that processed the semiconductor substrates and the sub-processes that applied to the semiconductor substrates, generated by the step of generating data, thereby inferring a causal manufacturing equipment that caused the defects.

According to another aspect of the invention, a method for processing detected defect data is provided. The method comprises: a step of generating a defects distribution on a semiconductor substrate in order to investigate the cause of the defects by processing detected defect data obtained by inspecting semiconductor substrates processed until a predetermined sub-process with an inspection equipment for defects or suspected defects occurred to the semiconductor substrates in a fabrication line consisting of a plurality of sub-processes arranged in sequence, each sub-process being performed by one or a plurality of manufacturing equipments; a step of quantitatively evaluating defect features of the defects distribution on a semiconductor substrate generated by the step of generating a defects distribution; a step of generating data of the defect features quantitatively evaluated by the step of quantitatively evaluating defect features for the manufacturing equipments that processed the semiconductor substrates and the sub-processes that applied to the semiconductor substrates; and a causation inferring step of evaluating cyclicity of the defect features data for the manufacturing equipments that processed the semiconductor substrates and the sub-processes that applied to the semiconductor substrates, generated by the step of generating data, thereby inferring a causal manufacturing equipment that caused the defects.

According to a further aspect of the invention, an apparatus for processing detected defect is provided. The apparatus comprises: a portion for generating a defects distribution on a semiconductor substrate in order to investigate the cause of the defects, based on detected defect data obtained by inspecting semiconductor substrates processed until a predetermined sub-process with an inspection equipment for defects or suspected defects occurred to the semiconductor substrates in a fabrication line consisting of a plurality of sub-processes arranged in sequence, each sub-process being performed by one or a plurality of manufacturing equipments; a portion for quantitatively evaluating defect features of the defects distribution on a semiconductor substrate generated by the portion for generating a defects distribution; a portion for generating data of the defect features quantitatively evaluated by the portion for quantitatively evaluating defect features for the manufacturing equipments that processed the semiconductor substrates and the sub-processes that applied to the semiconductor substrates, and a causation inferring portion for evaluating cyclicity of the defect features data for the manufacturing equipments that processed the semiconductor substrates and the sub-processes that applied to the semiconductor substrates, generated by the portion for generating data, thereby inferring a causal manufacturing equipment that caused the defects.

These and other objects, features and advantages of the invention will be apparent from the following more particular description of preferred embodiments of the invention, as illustrated in the accompanying drawings.

BRIEF DESCRIPTION OF THE DRAWINGS

FIG. 11A shows a graph plotting an example of matching (similarity) degree data sequence, according to the invention;

FIG. 11B shows a graph plotting another example of matching (similarity) degree data sequence, according to the invention;

FIG. 11C shows a graph plotting yet another example of matching (similarity) degree data sequence, according to the invention;

FIG. 14 shows a table of exemplary equipment data for use in the invention;

FIG. 15 consists of FIGS. 15A, 15B, 15C, 15D, 15E, and 15D showing examples of defects distributions which are generally found;

FIG. 18 consists of FIGS. 18A, 18B, and 18C showing examples of defects distributions which occur in different positions on a wafer;

DESCRIPTION OF THE PREFERRED EMBODIMENTS

Preferred embodiments of the method for manufacturing semiconductor devices and the manufacturing process management method according to the invention will now be described, using the accompanying drawings.

Figure 1:
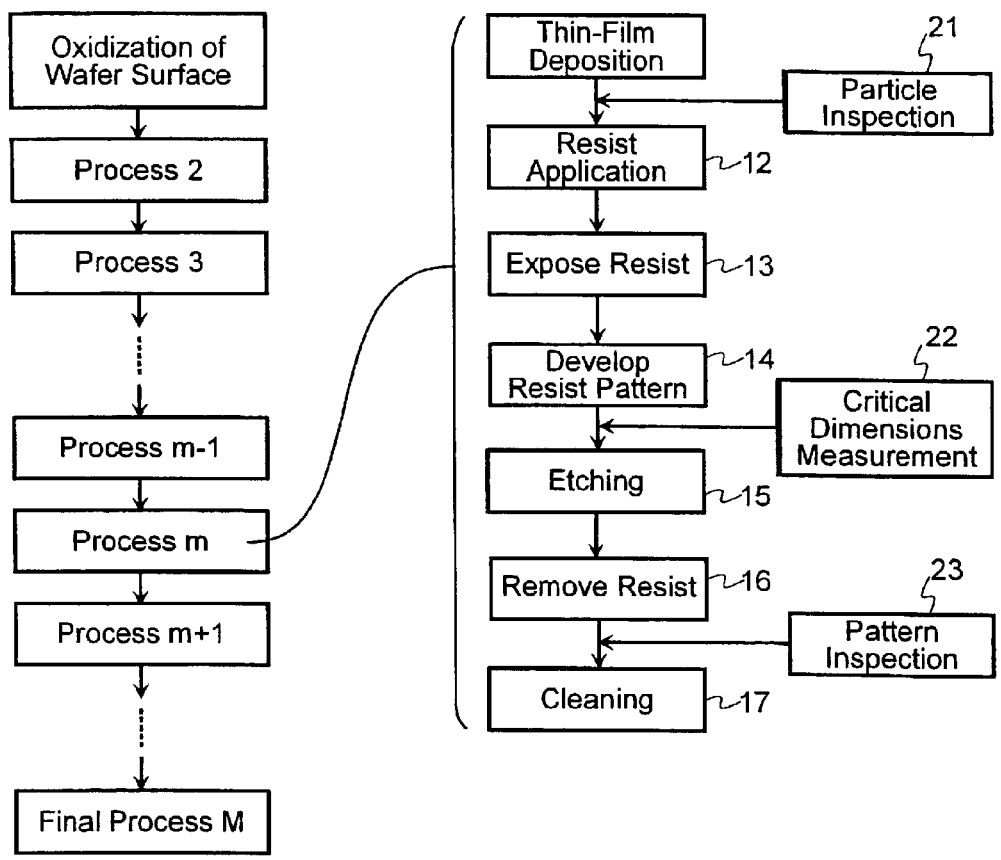
FIG. 1 is a diagram for explaining a semiconductor device manufacturing process.

As shown in FIG. 1, a semiconductor device is manufactured, beginning with the process of surface coating of a wafer with oxide film and through a great number of major processes of pattern forming 2 to M which are iteration as many times as the number of layers. A major process of pattern forming m essentially corresponds to one layer and is comprised of the following: a sub-process of thin-film deposition 11 for depositing conductive film and insulation film, using a deposition equipment such as a sputtering deposition equipment or CVD deposition equipment; a sub-process of resist application 12 for applying resist film to the conductive film and insulation film deposited by the sub-process of thin-film deposition 11, using a resist application equipment; a sub-process of expose resist 13 for exposing the resist to light that passes through a circuit pattern mask, using a stepper using i beams, an excimer laser exposure equipment, or the like; a sub-process of develop resist pattern 14 for developing the circuit pattern transferred onto the resist film; a sub-process of etching 15 for etching the conductive film and insulation film according to the resist circuit pattern developed by the sub-process of develop resist pattern 14, using an etching equipment, thereby forming the circuit pattern; a sub-process of remove resist 16 for removing the remaining resist; and a sub-process of cleaning 17 for cleaning the surface of the wafer.

The wafer being thus processed is inspected after critical sub-processes. For example, particle inspection 21: after being processed by the sub-process of thin-film deposition 11, the wafer (semiconductor substrate) is sampled and inspected for particles deposited during the thin-film deposition sub-process with a particle inspection equipment. Critical dimensions measurement: after being processed by the sub-process of develop resist pattern 14, the wafer is sampled and inspected to confirm whether the circuit pattern has been transferred onto the resist correctly with a critical dimensions measuring equipment. Pattern inspection 23: after being processed by the sub-process of remove resist 16, the wafer is sampled and inspected for defects such as short-circuits and breaks in the circuit pattern formed with the conductive film and insulation film, using a pattern inspection equipment.

Figure 2:
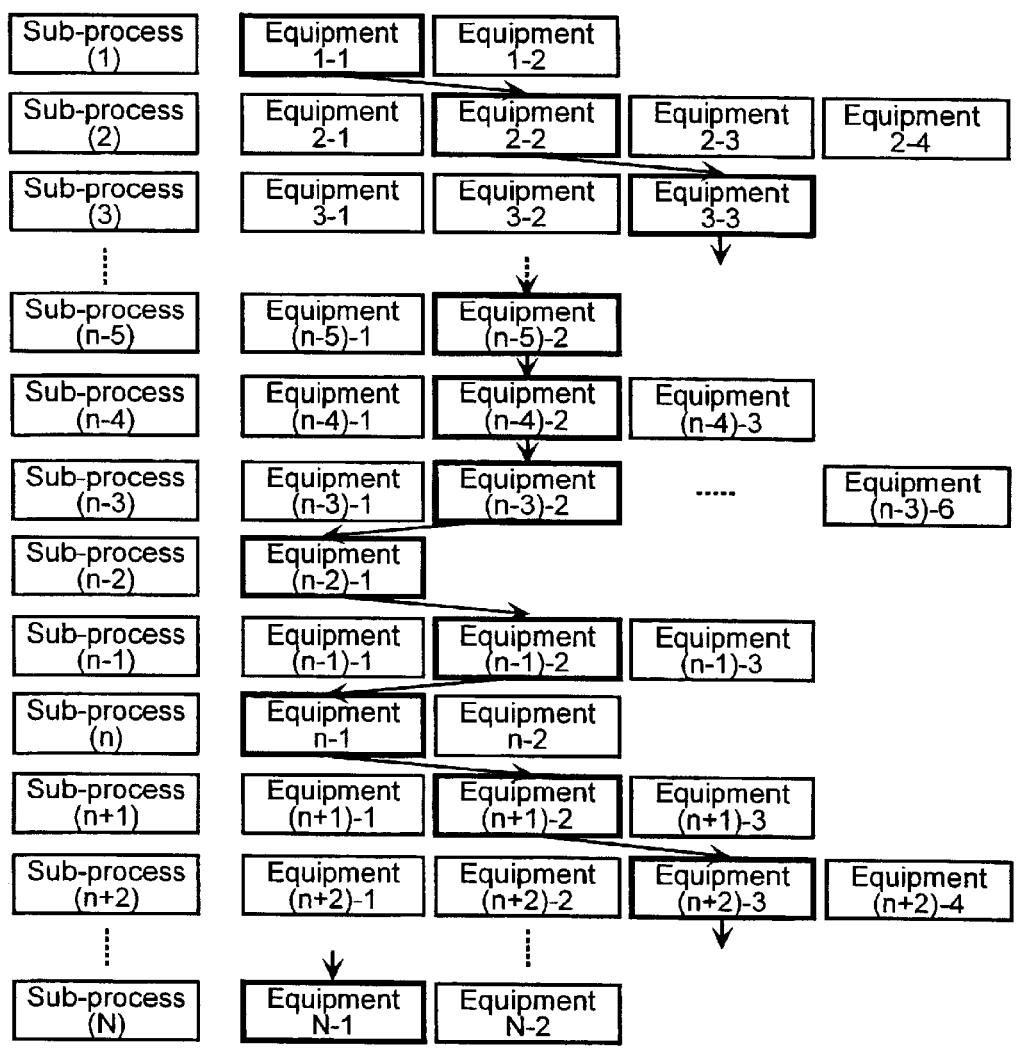
FIG. 2 is a, diagram for explaining sub-processes in a fabrication process of semiconductor devices, each sub-process using a plurality of manufacturing equipments.

FIG. 2 shows arrangement of sub-processes under a major process of pattern-forming for a semiconductor device, wherein the sub-processes are more detailed subdivision than those of a major process of pattern forming shown in FIG. 1 and shown with the manufacturing equipments that are used in each sub-process. Here, the sub-processes 1 to N shown in FIG. 2 include inspection processes with regard to particles, pattern defects, and dimensions in addition to the manufacturing processes such as thin-film deposition, exposure, etching, and cleaning. For the inspection processes, the associated equipments are inspection equipments or dimensions measuring equipments, not manufacturing equipments.

In ordinary semiconductor manufacturing processes, even the same semiconductor device is manufactured with a plurality of manufacturing equipments across a multiplicity of sub-processes as shown in FIG. 2. In a major process of pattern forming, for example, a wafer is fabricated with manufacturing equipment (1-1) in the first sub-process (1), manufacturing equipment (2-2) in the second sub-process (2), and manufacturing equipment (3-3) in the third sub-process 3. In further sub-processes (n–5) to (n–2), the wafer is fabricated with manufacturing equipments ((n–5)-2), ((n–4)-2), ((n–3)-2), ((n–2)-1), and ((n–2)-2), respectively. In a further sub-process (n), the wafer is fabricated with manufacturing equipment (n–1). In further sub-processes (n+1) to (n–3), the wafer is fabricated with manufacturing equipments ((n+1)-2) and ((n+2)-2) respectively. In the final sub-process (N), the wafer is fabricated with manufacturing equipment (N–1).

For example, if the sub-process n shown in FIG. 2 is an inspection sub-process, the source of a defect of the wafer detected by the inspection sub-process n is regarded as lying in any of the upstream manufacturing equipments ((n–2)-2) to ((n–5)-2) . . . (3-3), (2-2), and (1-1) involved in the fabrication of the wafer. This shows that the same defect may occur in other wafers fabricated with that same upstream manufacturing equipment as the source of the defect.

To reduce defects in fabricated wafers, when a fault on a wafer is found by inspection, it is important to identify which of the upstream manufacturing equipments that is the source of the fault as soon as possible and take remedy action for the equipment.

The invention is embodied as a semiconductor fabrication line management system making it possible to identify a particular sub-process and manufacturing equipment used therein that is the source of a defect quickly and take remedy action, using defect types, distribution of defects, and time sequence information obtained by inspection.

Figure 3:
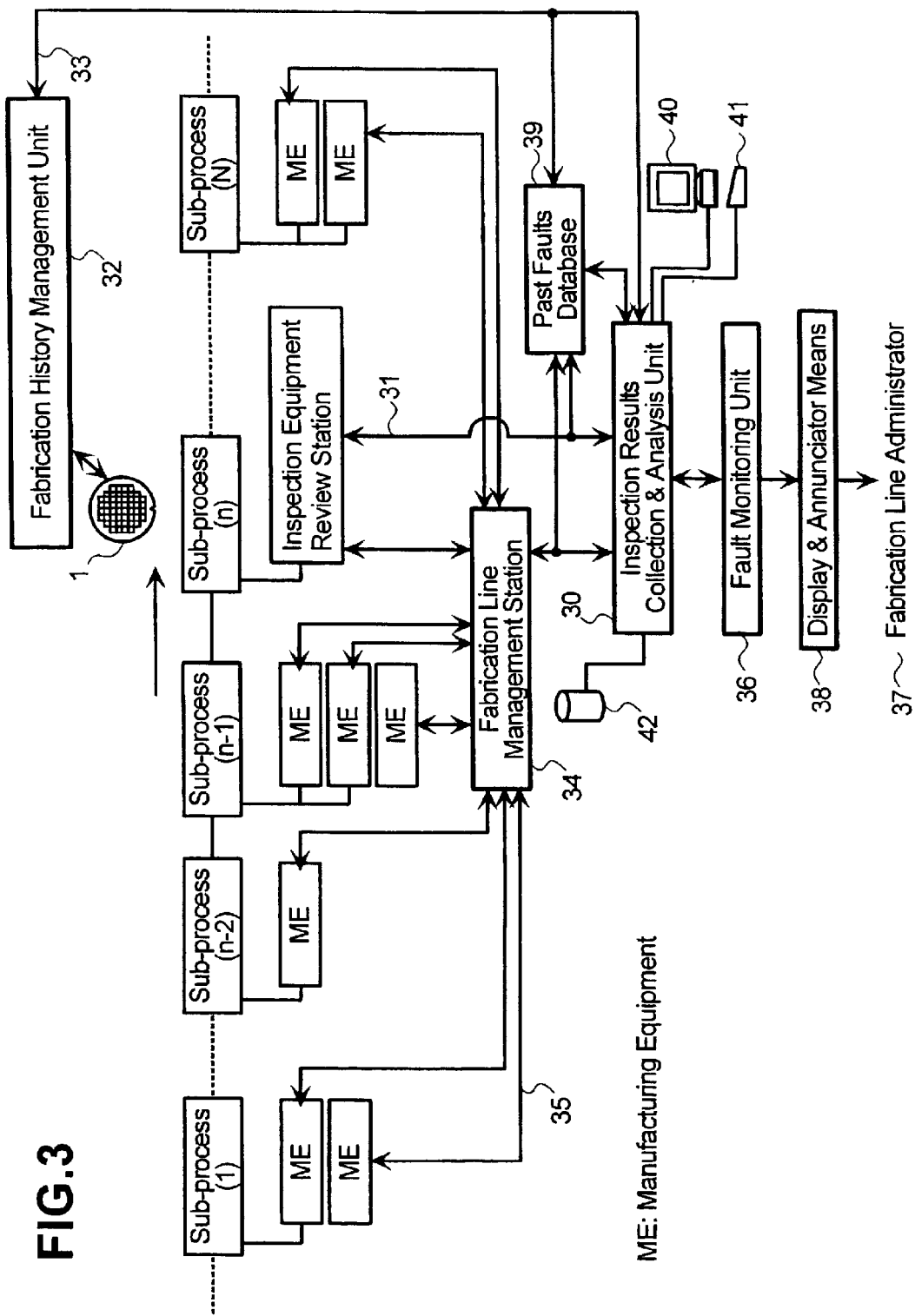
FIG. 3 is a diagram showing a system configuration of a semiconductor fabrication line, according to a preferred embodiment of the invention.

The embodiment of the semiconductor fabrication line management system according to the invention is configured for a major process of pattern forming as is shown in FIG. 3. On the semiconductor fabrication line, major processes of pattern forming are iterated. Sub-process (1) is implemented with manufacturing equipments (1-1) and (1-2). Sub-process (n–2) is implemented with manufacturing equipment ((n–2)-1). Sub-process (n–1) is implemented with manufacturing equipments ((n–1)-1) to ((n–1)-3). Sub-process (n) which is an inspection sub-process is implemented with inspection equipments (which may include a review station) (n–1) and (n–2). Sub-process (N) is implemented with manufacturing equipments (N–1) and (N–2). A fabrication line management station 34 to which all manufacturing equipments (including those for deposition such as sputters and CVD, exposure equipment and etching equipment) are connected via a network or supply data via recording media collects equipment data 35 that represents manufacturing conditions (manufacturing process conditions) including the configuration and history of each manufacturing equipment on the fabrication line.

A fabrication history management unit 32 manages the fabrication history of the sub-processes (1) to (N) of a wafer 1. By reading the product number of the wafer 1 in each sub-process, the fabrication history management unit stores fabrication history data into its storage (not shown).

An inspection results collection and analysis unit 30 that carries out data processing in accordance with the invention receives defects distribution or defects variation data 31 per type of defects that occurred to wafers inspected in the past from the inspection equipments (which may include the review station). The inspection results collection and analysis unit collects the above defects distribution or defects variation data 31 per defect type, the fabrication process data 33 for the wafers, sent from the fabrication history management unit 32, and the equipment data 35 that represents manufacturing conditions (manufacturing process conditions) including the configuration and history of each manufacturing equipment, sent from the fabrication line management station 34, and stores a multiplicity of defects that are possible to be judged faulty in a form of defects distribution data or defects variation data per defect type into a past fault database 39. In the past fault database 39, thus, defects distribution data or defects variation data per defect type from a multiplicity of defects is stored beforehand as will be shown in FIG. 4B and FIG. 7B, which is used as reference data for evaluating defects.

For each wafer (which may be each sampled wafer) flowing on the fabrication line, the inspection results collection and analysis unit 30 receives defects distribution or defects variation data 31 per defect type inspected by the inspection equipment or review station; collects the defects distribution or defects variation data 31 per defect type, the fabrication process data 33 per wafer, sent from the fabrication history management unit 32, and the equipment data 35 that represents manufacturing conditions (manufacturing process conditions) including the configuration and history of each manufacturing equipment, sent from the fabrication line management station 34; and compares the collected defects distribution or defects variation data 31 per defect type with the reference data per defect type from a multiplicity of past defects stored in the past fault database 39 for matching to a degree. In addition, by analyzing defects data, using the fabrication process data 33 per wafer and the equipment data 35 in combination, the inspection results collection and analysis unit 30 infers what manufacturing sub-process and manufacturing equipment used therein are the sources of defects per type of defects judged abnormal.

Once the inspection results collection and analysis unit 30 has determined a faulty manufacturing equipment, it sends fault information on the manufacturing equipment to a fault monitoring unit 36 and the fabrication line management station 34.

The fault monitoring unit 36 conveys the fault information received from the inspection results collection and analysis unit 30 to a fabrication line administrator 37 via display and annunciator means 38. On the other hand, the fabrication line management station 34 exerts control such as stopping the on-going fabrication process by the faulty manufacturing equipment and switches the operation to another manufacturing equipment that operates normally, based on the fault information received from the inspection results collection and analysis unit 30. If the manufacturing equipment can recover from the fault by altering the process conditions thereof, the fabrication line management station, of course, exerts control for adjusting the process conditions.

The invention will be described in further detail. As the result of inspection by the inspection equipment (n−1), suppose that, for example, a great quantity of defects such as particles have occurred, distributed on a wafer as is illustrated by a case D1 in FIG. 4. The point the invention aimed at is that, if, among the wafers inspected by the inspection equipment in the past, there is a wafer on which the same type defects such as particles having the same or similar characteristic distribution occurred, it can be inferred that the defects such as particles having the same causal relationship would occur on the wafer.

Figure 4A:
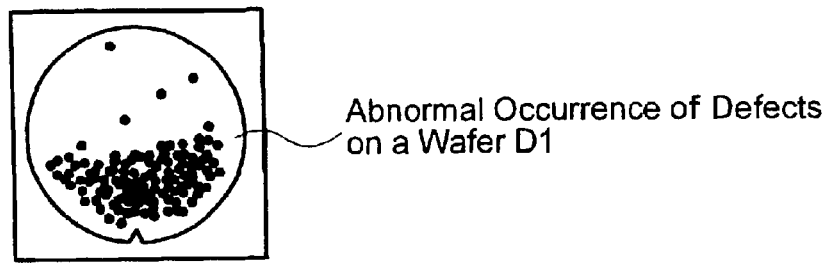
FIG. 4A illustrates defects distribution detected on a wafer.
Figure 4B:
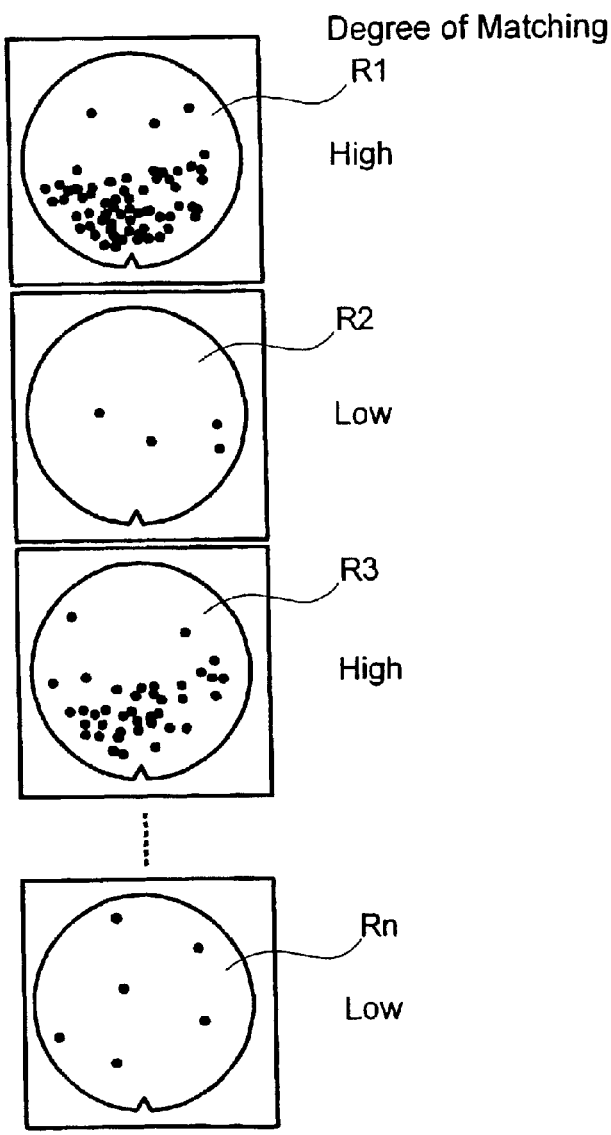
FIG. 4B illustrates past defects distributions, which explains, in combination of FIG. 4A, evaluation of a degree of matching between the defects distribution of FIG. 4A and the defects distributions of FIG. 4B, according to a preferred embodiment of the invention.

Specifically, the invention is embodied such that the inspection results collection and analysis unit 30 compares the defects distribution D1 showing abnormal occurrence of defects on the wafer detected by the inspection equipment or review station (n−1) shown in FIG. 4A with the inspection results (past defects distributions) R1 to Rn of the wafers inspected in the past, shown in FIG. 4(b), which have been stored in the past fault database 39, evaluates a degree of matching quantitatively, and determines what sub-process and manufacturing equipment used therein is likely to cause the defects, using the evaluation value. In the case of FIG. 4, such quantitative evaluation is possible that the defects distribution D1 showing abnormal occurrence of defects on the wafer matches with the past defects distributions R1 and R3 at high degrees. Thus, the spectrum of inferring the source can be narrowed down to the sub-processes and related manufacturing equipments that caused the past defects distributions R1 and R3.

Figure 5A:
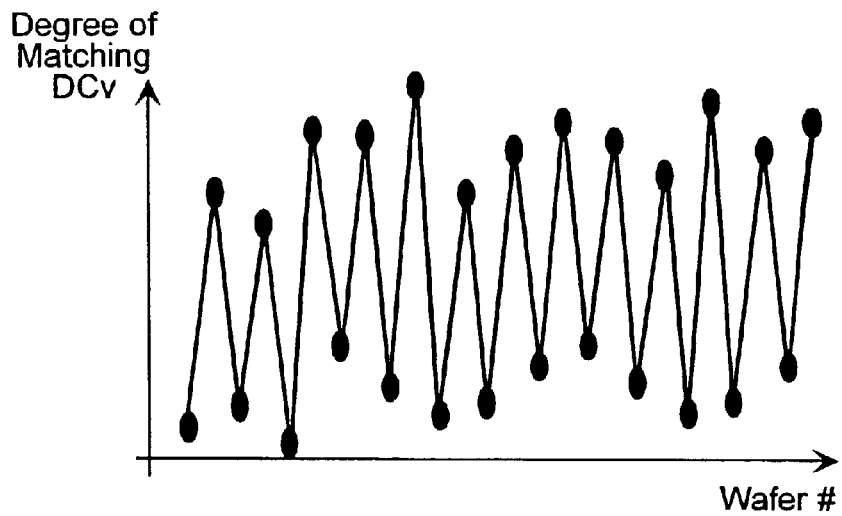
FIG. 5A is a graph representing cyclic occurrence of defective wafers.

For example, for wafers of one lot, suppose that, from the results of evaluation of a degree of matching of the defects distribution D1 showing abnormal occurrence of defects on a wafer shown in FIG. 4A with the past defects distributions, a graph in FIG. 5A is obtained (how to evaluate a degree of matching will be described later).

Figure 5B:
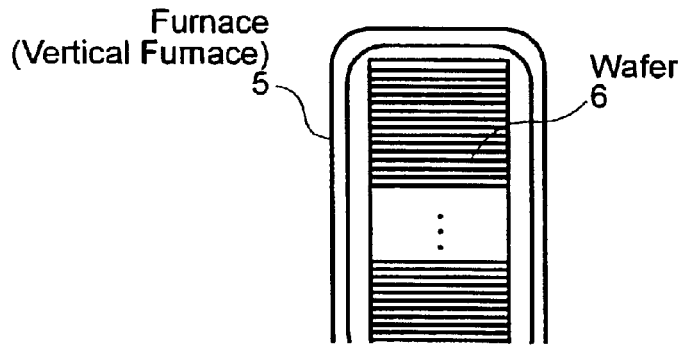
FIG. 5B illustrates the structure of a manufacturing equipment.

If, among the manufacturing equipments engaged in fabricating these wafers, the manufacturing equipment ((n−2)−1) for the sub-process (n−2) and the manufacturing equipment ((n−1)−2) for the sub-process (n−1) are likely sources of defects, which equipment is the source is identified in the following manner. For example, the sub-process (n−2) is heat treatment and several tens of wafers 6 are simultaneously loaded into its heat treatment furnace (vertical furnace) 5 as is shown in FIG. 5B.

Figure 5C:
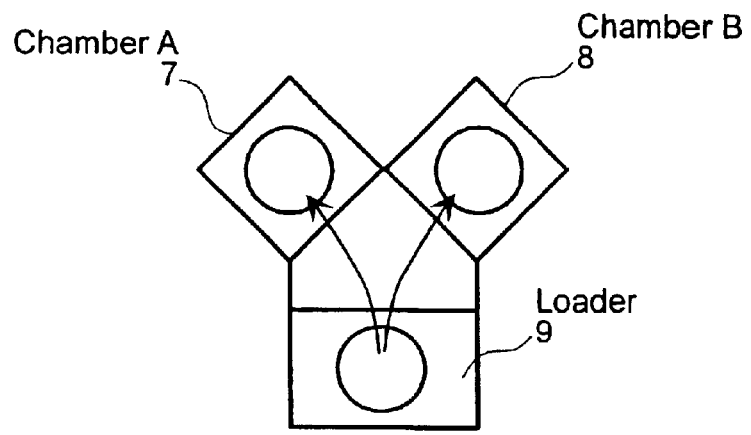
FIG. 5C illustrates the structure of another manufacturing equipment; from the relationship between the equipment structure and the cyclic defect occurrence of FIG. 5A, the defect source is inferred, according to a preferred embodiment of the invention.

On the other hand, the sub-process (n−1) is CVD process and the equipment for the process ((n−1)−2) has two chambers as is shown in FIG. 5C and the wafers in the lot are alternately loaded into chamber A 7 and chamber B 8. From this, the CVD equipment shown in FIG. 5C can be inferred to cause a great number of defects occurring every second wafer as shown in FIG. 5A. To the CVD equipment, odd-numbered wafers are loaded into chamber A and even-numbered wafers are loaded into chamber B, the process in the chamber B can be identified as the source of the great number of defects. Thus, what to do is investigating the cause of the defects for the chamber B. During the investigation and remedy action, the sub-process can be carried out, using another CVD equipment. The sub-process can be carried out with chamber A only if circumstances permit.

In the invention, the inspection results collection and analysis unit 30 calculates the frequency of cyclic occurrence of defective wafers by frequency analysis; one defective wafer occurs per two wafers in this embodiment. Moreover, from the inspection results collection and analysis unit 30, the operator can register in advance the units of wafers to be processed at a time by the equipment for all manufacturing equipments (in the above-described embodiment, the number of chambers of the CVD equipment as equipment data and the number of wafers to be loaded into the furnace as wafer process data) 33 and 35, which are stored into the fabrication history management unit 32 and the fabrication line management station 34. By receiving the thus stored data 33 and 35 and using them in combination with the inspection results data, the inspection results collection and analysis unit 30 can identify a particular manufacturing equipment that is the source of the defects in the manner described above. If the inspection results collection and analysis unit 30 can quickly determine what manufacturing equipment and related sub-process caused the defects in this manner, the fault information is presented to the fabrication line management station 34 and the fabrication line administrator 37. By stopping the fabrication process by the faulty equipment and sub-process, unacceptable wafers resulting from any fault in the manufacturing process can be minimized.

Then, how the inspection results collection and analysis unit 30 analyzes the inspection results data will be described in further detail, using FIG. 6.

The inspection results collection and analysis unit 30 first presents defect maps data (defects distributions) identifiable per defect type received from the inspection equipment or review station (n–1) or (n–2) to its operator; for example, displaying that data on its display device 40. According to the operator's judgment, specify a defect type and related defect map for which the cause of abnormal defects need to be investigated, using input means 41 (step S61). If a criterion for abnormal defects judgement is set beforehand, it is also possible that the inspection results collection and analysis unit 30 automatically selects and designates a defect type and related defect map for which the cause of the defects need to be investigated from among the defects distribution or defects variation data 31 per defect type received from the inspection equipment or review station (n–1) or (n–2). For, example, if the number of defects obtained from the inspection results received from the inspection equipment or review station (n–1) or (n–2) exceeds a value that is critical for management, as is illustrated in FIG. 7A, the inspection results collection and analysis unit 30 automatically selects the map of such defects for which the cause of the defects should be investigated, using the defects distribution.

In the alternative, it may be also possible that the inspection results collection and analysis unit 30 selects a defects distribution to be analyzed, obtained by merging the inspection results received from the inspection equipment or review station (n–1) or (n–2) and past inspection results so that newly detected defects are superposed on the past defects distribution, as is illustrated in FIG. 7B.

By thus merging the inspection results received from the inspection equipment or review station (n–1) or (n–2) and the past inspection data into a map of defects, it is possible to detect defects that do not occur in quantity, but constantly happen and investigate the cause of such defects. In this case, before specifying a defects distribution to be analyzed, it is necessary to exclude the data for a wafer on which a great number of defects apparently occur.

Figure 7:
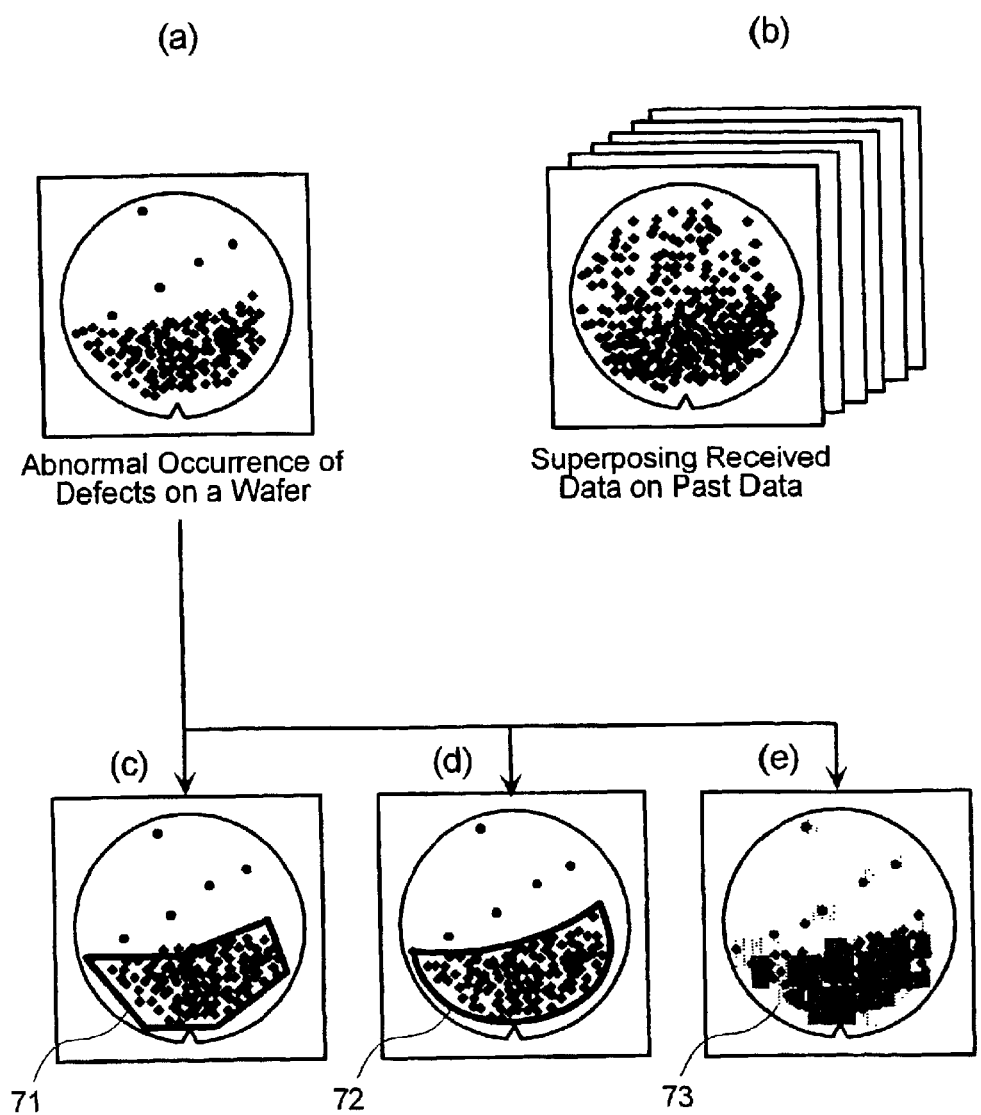
FIG. 7A illustrates an example of a defect map obtained, according to the invention.
FIG. 7B illustrates another example of a defect map obtained, according to the invention.
FIG. 7C illustrates an example of a defects distribution which is specified (or generated) to help investigate the cause of the defects, according to the invention.
FIG. 7D illustrates another example of the above-mentioned defects distribution.
FIG. 7E illustrates a further example of the above-mentioned defects distribution.

In the step S61, specifying a defects distribution to be analyzed may be carried out such that, on a map of defects displayed on the display device 40, as is illustrated in FIG. 7, the operator may set a target of analysis, using software for drawing a figure like the one shown in FIG. 7C, or a region having defects of high density 73 may be automatically selected under software control, as is exemplified by an example illustrated in FIG. 7D. For example, in some embodiment, it may be preferable to divide the map of defects on a wafer into a plurality of small regions, evaluate the density of defects in each region, and select a region having defects of the highest density. Data defining the region may be expressed by a set of coordinates data for each small region. If a polygonal region is generated, a set of the coordinates of its vertices may be used to define the region. In the alternative, in some embodiment, it may be also preferable to use the density of defects within each small region as is, show difference in the density by region in tone gradation 73, and generate a defects distribution image, for example, like the one illustrated in FIG. 7E, thereby showing the distribution of defects occurred all over the wafer.

When selecting a defects distribution on a defect map, it may be also preferable to use defect information received from the inspection equipment or defect viewer (review station) (n–1) or (n–2). The defect information designates the type of defects such as, for example, pattern formation defects which are illustrated in FIG. 8D (pattern defects; e.g., breaks (including near breaks) and short circuits (including near short circuits)), particles on the surface of a wafer which are illustrated in FIG. 8B, and scratches which are illustrated in FIG. 8C as well as the extent of defects in terms of dimensions and area. The defect information would be helpful, in particular, for cases where defects resulting from different causes happen to have similar distributions or where different types of defects simultaneously occur from a plurality of causes, making it difficult to identify a defects distribution of which type of defects. For example, once the inspection results collection and analysis unit 30 classifies the inspection results received from the inspection equipment or defect viewer (review station) (n–1) or (n–2) into defect types, defects distributions according to the defect types can be obtained. By following the steps S62 to S64, analysis for investigating the cause applies to each defect type so that the accuracy of analysis can be enhanced by using defects distribution data from defects of the same type. All defects distributions thus obtained may be discretely analyzed or only the defects or distributions of defects that are especially critical may be analyzed. For these distributions, a region of high density of defects should be selected for analysis as illustrated in FIG. 7.

Figure 9:
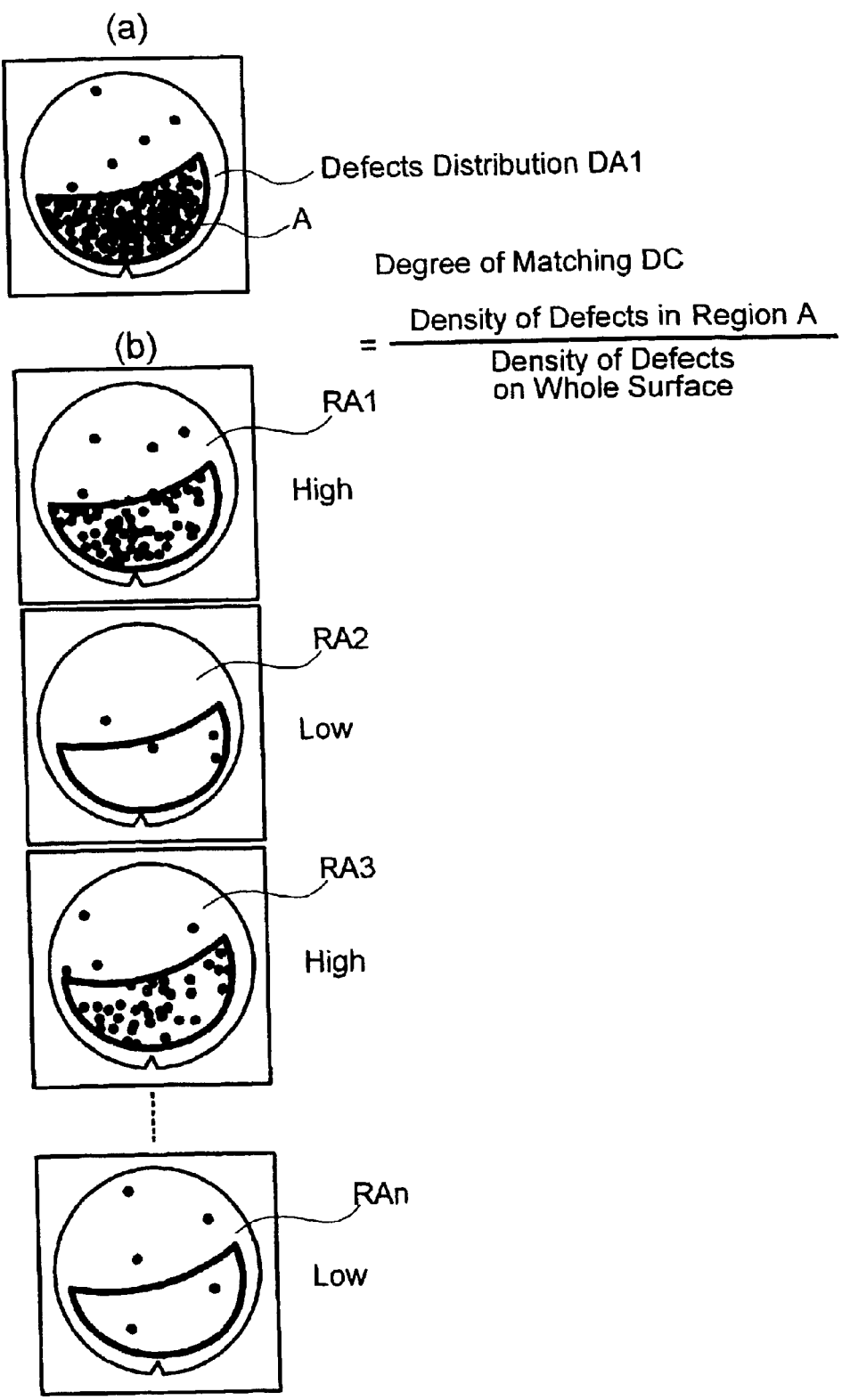
FIG. 9A illustrates a defects distribution whose degree of matching (similarity) with defects distributions from a database is calculated, according to the invention.
FIG. 9B illustrates examples of defects distributions from a database.

Then, how the inspection results collection and analysis unit 30 executes a step 62 of evaluating a degree of matching, which is mentioned in FIG. 6, will be explained. In the step 61, the inspection results collection and analysis unit 30 evaluates a degree of matching of the defect type and defects distribution selected as illustrated in FIG. 7 with the distributions of defects on wafers inspected in the past which are stored in the past fault database 39. For example, suppose that a defects distribution DA1 in a region A having the defects to be analyzed, as is illustrated in FIG. 9A, has been selected. For defects distributions RA1 to RAn on wafers inspected in the past, which are illustrated in FIG. 9B, obtain the density of defects in the selected region A and divide it by the density of defects on the whole surface of the wafer extracted for evaluation of matching with the past defects. A thus normalized value should be used as the index of a degree of matching. For the case illustrated in FIG. 9, evaluation is that the defects distribution DA1 in the region A having the defects to be analyzed matches with the defects distributions RA1 and RA3 on the wafers inspected in the past to a high degree.

Figure 8:
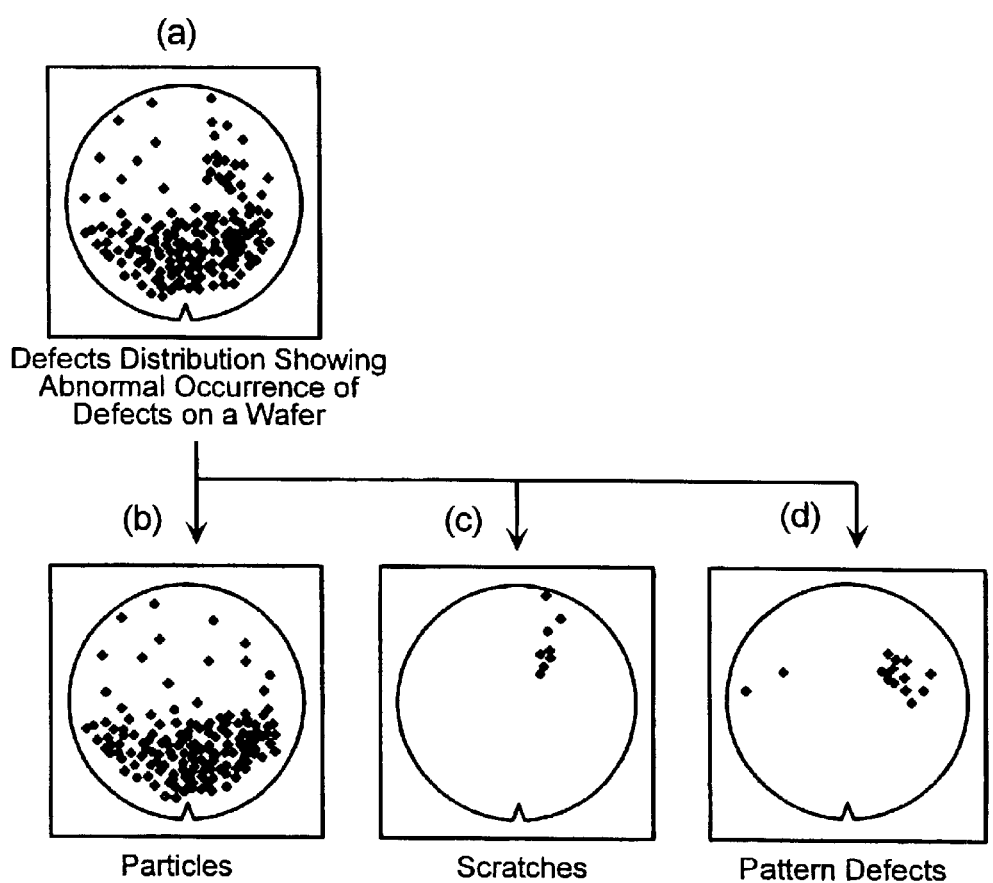
FIG. 8A illustrates an example of distribution of defects obtained from inspection results, which is classified by defect type, according to the invention.
FIG. 8B illustrates a defect type of particles.
FIG. 8C illustrates a defect type of scratches.
FIG. 8D illustrates a defect type of pattern defects.

In another embodiment where each of small regions on the wafer has different density of defects as illustrated in FIG. 7E, the inspection results collection and analysis unit 30 executes the same processing for the data obtained from the past inspection and stored in the past fault database 39. For the resultant two-dimensional data sequences, spatial correlation between the defects distribution selected for analysis and the past defects distributions should be used as the degree of matching. Such two-dimensional data sequences can be treated in the same way as for tone gradation images. By application of image pattern matching techniques, matching can be evaluated for cases where similar defects density distributions occur at different positions. In this case, a degree of matching of similar patterns as well as discrepancy thereof can be obtained. About how to evaluate matching for cases where similar defects distributions occur at different positions, embodiments thereof will be described separately. By executing the described processing after classifying the inspection results according to the defect type and extent, as illustrated in FIG. 8, analysis can be performed more exactly.

Figure 10:
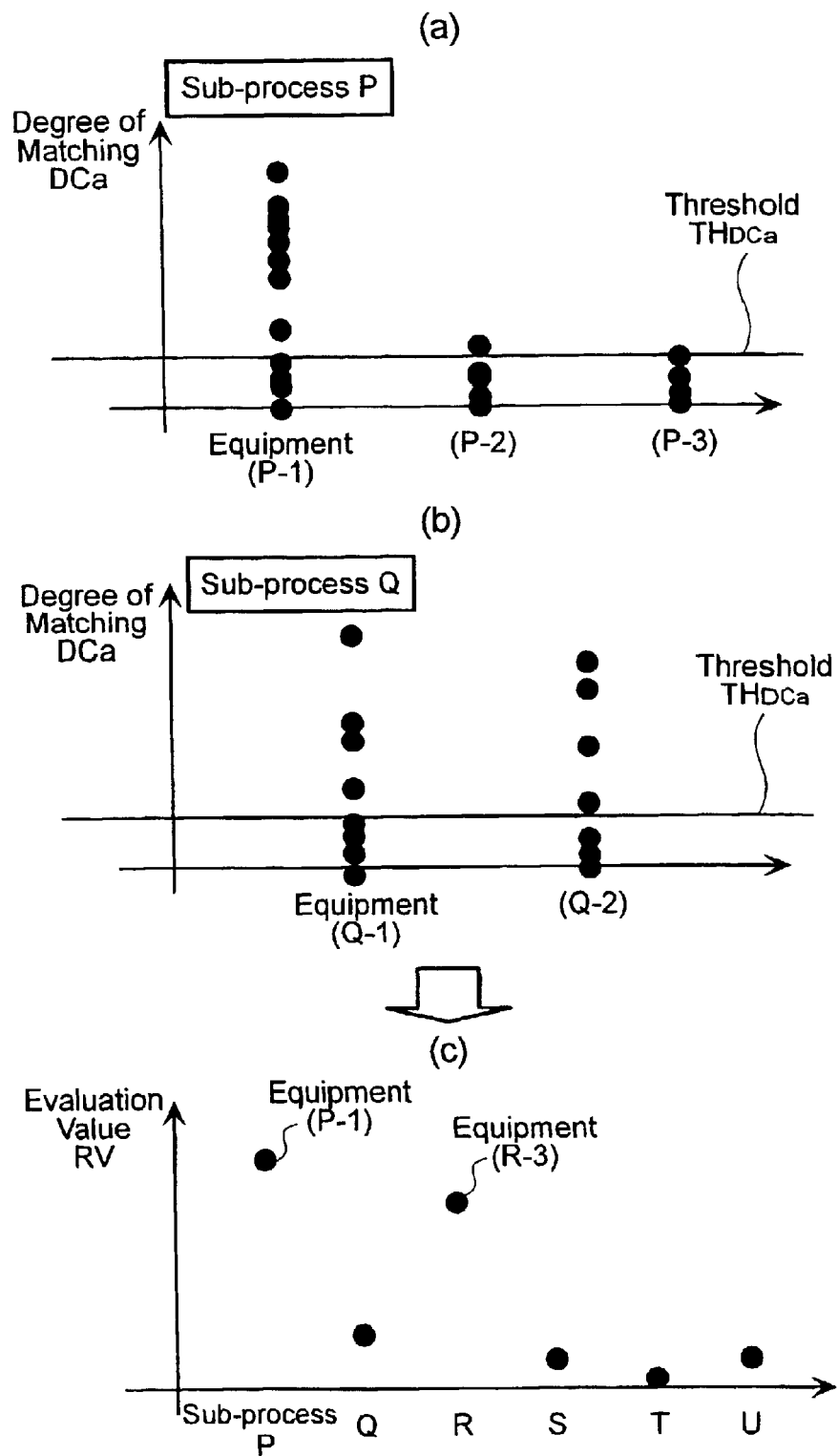
FIG. 10A shows a graph of matching (similarity) degree vs. equipment relationship in a sub-process.
FIG. 10B shows a graph of matching (similarity) degree vs. equipment relationship in another sub-process.
FIG. 10C shows a graph of evaluation values vs. sub-process relationship, which is used in combination with FIGS. 10A and 10B for extracting sub-processes as likely sources of defects, according to the invention.

Then, how the inspection results collection and analysis unit 30 executes a step 63 of selecting sub-processes as likely sources of defects, which is mentioned in FIG. 6, will be explained. As is illustrated in FIG. 10, the inspection results collection and analysis unit 30 first calculates a degree of matching of defects distributions (spatial correlations) DCa calculated in the step S62 for each manufacturing equipment that processed wafers having similar defects distribution ((P–1) to (P–3), (Q–1) to (Q–2), (R–1) to (R–3), . . . ).

As is shown in FIG. 10A, for a sub-process (P) in which the defects distribution to be analyzed occur only with a particular manufacturing equipment (P–1) used in the sub-process, only the causal equipment (P–1) has a high degree of matching DCa. By contrast, for a sub-process (Q) not having causal relationship, each manufacturing equipment used in the sub-process has similar distribution of values of the degree of matching DCs, as is shown in FIG. 10B.

Then, the inspection results collection and analysis unit 30 sets a suitable threshold $TH_{DCa}$ of the calculated matching (spatial correlation) degree DCa for the sub-processes (P to U). The inspection results collection and analysis unit 30 selects a manufacturing equipment that has the matching degree DCa more than the threshold $TH_{DCa}$ and processed the most wafers in each sub-process (a manufacturing equipment (P–1) in the sub-process (P) and a manufacturing equipment (R–3) in the sub-process (R)), calculates the number of wafers processed by the selected equipment as an evaluation value RV, and compares the sub-processes. Consequently, high evaluation values RV are obtained in sub-processes (P and R) in which the manufacturing equipments have different values of matching degree DCa, that is, matching greatly differs, depending on the manufacturing equipment. Thus, the sub-processes (P and R) with high evaluation values RV and the manufacturing equipments ((P–1) and (R–3) that have the greatest matching degree DCa in these sub-processes should be selected as likely sources of defects.

Particularly, if which wafer that suffered abnormal occurrence of defects is identified, a manufacturing equipment having a high evaluation value RV must have processed the wafer. Thus, manufacturing equipments that have a high evaluation value RV and processed the defective wafer should be extracted as sub-processes and equipments as likely sources of defects. The inspection results collection and analysis unit 30 can implement the step S63 by calculating evaluation values RV for the sub-processes (P to U) as shown in FIG. 10C and selecting sub-processes having a high evaluation value RV as likely sources of defects.

Even if sub-processes as likely sources of defects have been selected successfully in the step S63, as illustrated in FIG. 10, there are many cases where a sub-process that is a real source of defects cannot be pinpointed. This is because there are cases where wafers are processed through a fixed combination of manufacturing equipments to be used across a plurality of sub-processes or where a plurality of manufacturing equipments are not in use in some sub-process. For example, if only one equipment that processes wafers is used in a sub-process, its evaluation value RV shown in FIG. 10C might become high from the relationship by which a manufacturing equipment that has a matching degree DCa more than the threshold $TH_{DCa}$ and processed the most wafers is extracted. Thus, the inspection results collection and analysis unit 30 need to pinpoint a sub-process and related manufacturing equipment as the source of defects by further executing a step S64 of analyzing cyclicity of matching degree data (a set of data including a time factor) or its data sequence, which is mentioned in FIG. 6.

Then, how the inspection results collection and analysis unit 30 executes the analysis method of the step 64 mentioned in FIG. 6 will be explained.

If the cause of defects lies in a manufacturing equipment, the cycle of occurrence of defective wafers produced by the equipment differs, according to the type of the manufacturing equipment and the cause. These defective wafers occur in different aspects. For some defect type, the number of defective wafers increases and decreases, which shows apparent cyclicity as shown in FIG. 5A. For another defect type, the number of defective wafers changes in a long cycle from several days to several tens of days. For another defect type, once a defective wafer occurs, it continues to occur. For another defect type, the number of defective wafers gradually increases or decreases. For another defect type, after defective wafers occurs for a period, the occurrence suddenly stops. In the following, an embodiment example of processing a set or sequence of such data that varies differently (including a time factor) will be explained.

First, the inspection results collection and analysis unit 30 checks the period of occurrence of the defects distribution to be analyzed, received from the inspection equipment or defect viewer (review station) (n–1) or (n–2). Specifically, this is implemented as follows. As is illustrated in FIGS. 11A, 11B, and 11C, after setting a suitable threshold $TH_{DCv}$ for a set or sequence of matching degree data (matching degree change) DCv, the period of occurrence of matching degrees more than the threshold $TH_{DCv}$ should be checked. Using the data following a point at which a matching degree more than the threshold was first found, matching degree variation or fluctuation over time is analyzed.

FIG. 11A shows a case of defects having cyclicity in which the matching degree DCv rises to a point and falls, which recurs. FIG. 11B shows a case of defects having cyclicity in which the matching degree DCv up and down recurs every second wafer or each a plurality of wafers are processed. FIG. 11C shows a case of defects in which the matching degree DCv varies without cyclicity. Any graphic representation in these drawings shows correlation between the matching degree variation or fluctuation and the structure or mode in which the manufacturing equipment processes wafers or the process conditions.

In this relation, the inspection results collection and analysis unit 30 carries out the analysis of matching degree variation or fluctuation in two stages. In the first stage, check is made for cyclicity of defects across the wafers processed concurrently or sequentially by the process and related equipment and the matching degree data for the wafers arranged in sequence in which they were processed is analyzed for matching degree variation or fluctuation. If a set of sequence of such data is available, frequency analysis should be performed for the data, using a FFT or the like. If not, an average of matching degree data for each of the wafers processed under the same conditions should be obtained and frequency analysis performed for a sequence of the thus obtained data. For example, if 25 wafers in a lot are processed sequentially by equipment, matching degree data for same-numbered wafers is averaged to generate a sequence of 25 data for which frequency analysis then should be performed. From the results of analysis, by selecting a manufacturing equipment for which the cycle in which it processes wafers corresponds to the cycle of variation or fluctuation of matching degree DVc, it is possible to pinpoint a manufacturing equipment that caused the defects of interest.

Figure 12:
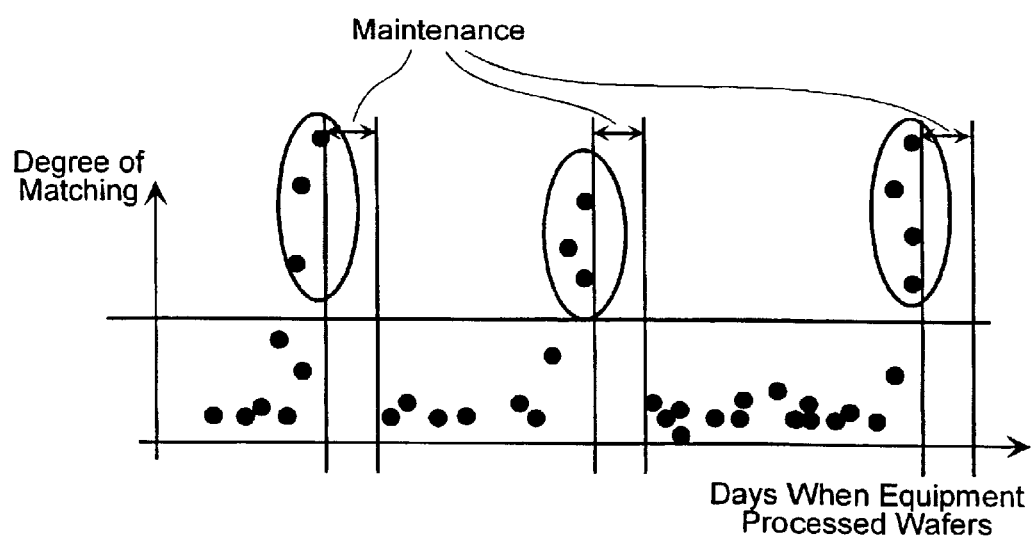
FIG. 12 shows a graph plotting a further example of matching (similarity) degree data sequence, according to the invention.

The cycle in which equipment processes wafers will be explained below. In the second stage, check is made for matching degree variation or fluctuation during a longer period, that is, variation of fluctuation of occurrence of defective wafers for several days is checked. For example, as is shown in FIG. 12, the matching degree evaluation results for wafers processed by an equipment are arranged in sequence of days when the equipment processed the wafers and check is made for data of high matching degrees. For example, by selecting data of matching degrees higher than a certain threshold THDCv or finding a highest value in data sequence, check for a cycle of occurrence of wafers having high matching degrees. If such wafers occur intermittently as in the example shown in FIG. 12, judge whether they occur at certain intervals or non-periodically. Using the records of a manufacturing equipment such as fabrication process logs and maintenance logs received from the fabrication line management station 34, check to see whether the time when the equipment processed the above wafers corresponds to the maintenance cycle or time before or after the maintenance. If so, the process by the equipment is likely to cause the defects and thus the equipment is extracted as a likely source of defects. If the wafers having high matching degrees occur non-intermittently, an equipment for which maintenance was performed at time corresponding to the time when such wafers begin to appear is extracted as a likely source of defects. By executing this analysis for all equipments in the sub-processes selected as likely sources of defects, the spectrum of extracting equipments as likely sources of defects can be further narrowed down.

Figure 6:
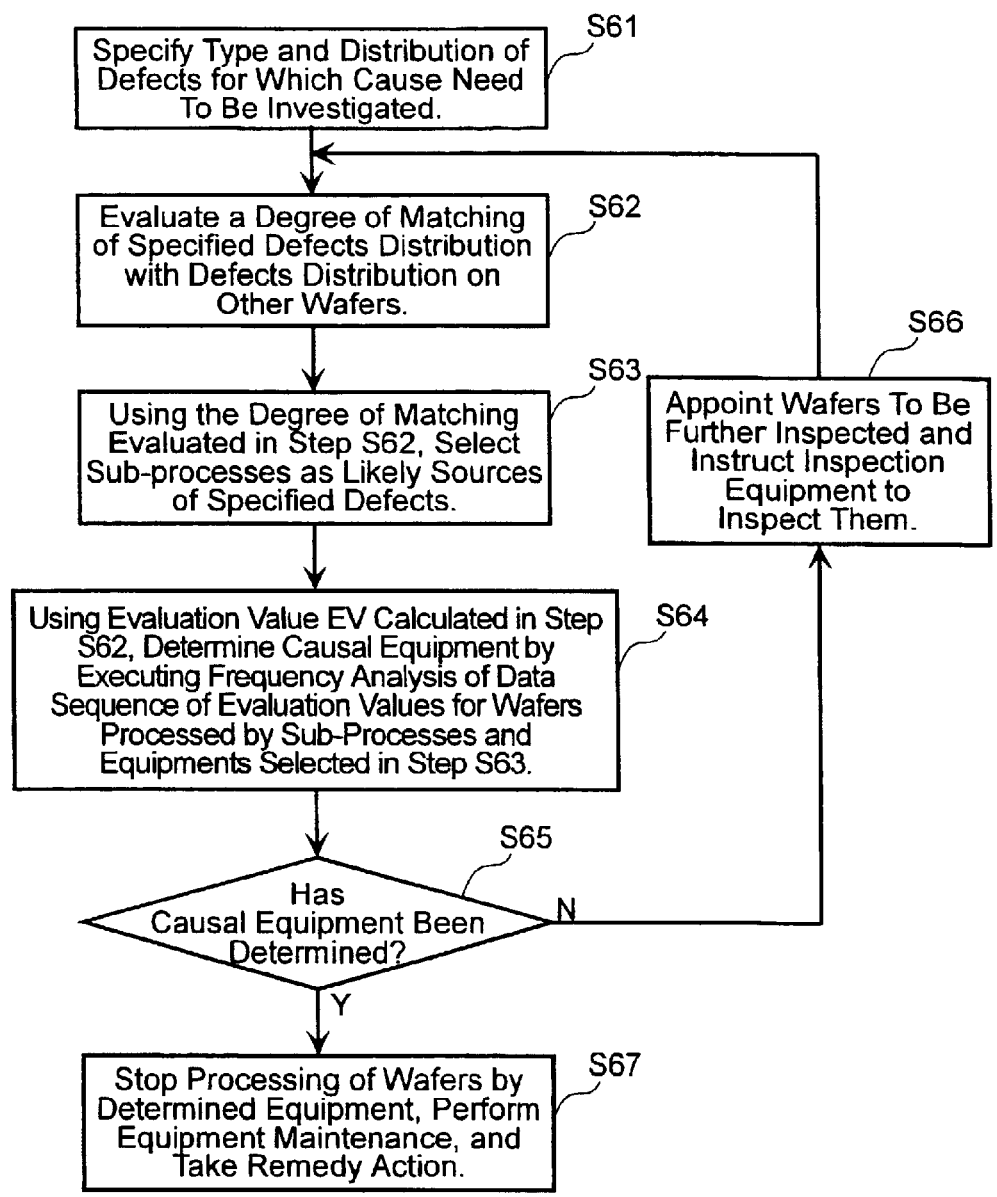
FIG. 6 is a flowchart of a procedure for processing detected defect data, according to a preferred embodiment of the invention.

If the inspection results collection and analysis unit 30 cannot determine a sub-process and related manufacturing equipment that caused defects in the step 65 of FIG. 6 in the manner described above, it goes to a step S66. Despite the attempts to pinpoint causal sub-processes, it may be impossible to pinpoint a particular sub-process and related manufacturing equipment because the inspected wafers are few or because sufficient frequency analysis cannot be performed. In such cases, to identify which of the sub-processes remaining as likely sources of the defects, perform additional inspection with the inspection equipment (n–1) or review station (n–2). If it is found that wafers belonging to the same lot of the wafer on which abnormal occurrence of defects was detected are not yet inspected, based on the data from the fabrication history management unit 32, the inspection results collection and analysis unit 30 first instructs the inspection equipment (n–1) or review station (n–2) to execute inspection of the remaining wafers in the same lot. By executing cyclicity analysis of the matching degrees DCv of the remaining wafers in the lot obtained from the additional inspection, a particular manufacturing equipment can be identified as the source of the defects with a high probability, based on the units of wafers processed by equipment as in the above-described embodiment. Therefore, the same lot is first inspected, if the inspection process has sufficient throughput.

Figure 13:
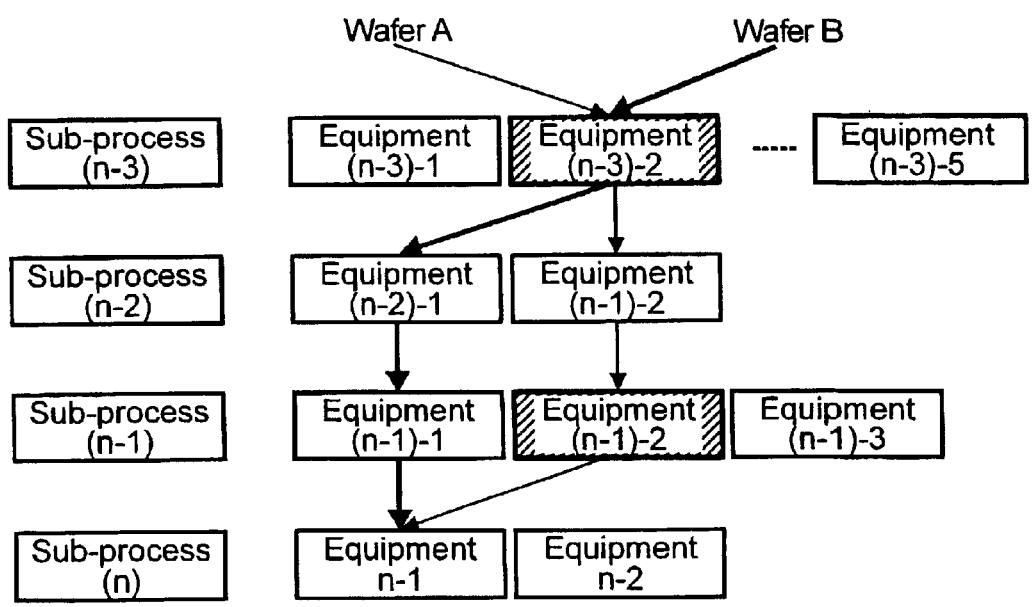
FIG. 13 is a diagram for explaining how to select wafers to be inspected, according to the invention.

For the inspection equipment that is not high throughput, it is difficult to inspect all remaining units in the same lot. In such cases where cyclicity analysis cannot be performed, the inspection results collection and analysis unit 30 selects the wafers processed only with one of the plurality of manufacturing equipments of likely sources and instructs the inspection equipment (n–1) or review station (n–2) to inspect the selected wafers, so that it can determine a causal sub-process efficiently. Referring to FIG. 13, for example, suppose that two manufacturing equipments ((n–3)–2) and ((n–2)–2) which are shaded are likely sources of defects. Suppose that wafers A were fed and processed by the manufacturing equipments, as indicated by thin arrows, and wafers B were fed and processed by the manufacturing equipment, as indicated by bold arrows. If the wafers A processed by both manufacturing equipments ((n–3)–2) and ((n–1)–2) are inspected, a causal process cannot be determined. However, if the inspection results collection and analysis unit 30 instructs the inspection equipment (n–1) or review station (n–2) to inspect the wafers B processed only by the manufacturing equipment (n–3)–2, it can determine the equipment (n–3)–2 as the source if the matching degrees of the inspected wafers are high and the equipment ((n–1)–2) as the source if the matching degrees of the inspected wafers are low, using the results of this inspection.

If there are three or more manufacturing equipments as likely sources, the inspection results collection and analysis unit 30 instructs the inspection equipment (n–1) or review station (n–2) to inspect wafers in the following procedure. First, inspect first wafers processed with a half of the manufacturing equipments of likely sources. If the inspection results collection and analysis unit 30 judges the matching degrees of the inspected first wafers high, inspect second wafers processed with a half of the manufacturing equipments that processed the first wafers. If the inspection results collection and analysis unit 30 judges the matching degrees of the inspected first wafers low, inspect third wafers processed with the remaining half of the manufacturing equipments of likely sources. Repeat the above inspection process. If there remains a plurality of sub-processes as likely sources in which one equipment processed the wafers, the inspection results collection and analysis unit 30 would determine a causal sub-process by instructing the inspection equipment to inspect the wafers processed by intermediate sub-processes. The inspection results collection and analysis unit 30 can select the wafers to be inspected, based on the fabrication process data per wafer received from the fabrication history management unit 32. If wafers in other lots are inspected, it is desirable to use same-numbered wafers as the wafer on which the critical defects occurred and the source thereof is being sought.

Once the inspection results collection and analysis unit 30 has determined a manufacturing equipment that caused the defects by executing the steps 61 through 66 mentioned in FIG. 6, it stops the fabrication process by the causal manufacturing equipment and outputs instructions to do troubleshooting and maintenance to the display and annunciator means 38 via the fabrication line management station 34 and the fault monitoring unit 36. Thereby, at least the sub-process performed by the causal manufacturing equipment stops and further fabrication of unacceptable wafers can be avoided.

As described hereinbefore, for wafers flowing through the sub-processes along the production line, the inspection results collection and analysis unit 30 is able to infer what sub-process and related manufacturing equipment caused critical defects through the following steps: receiving the defects distribution or defects variation data 31 per type of defects occurred to the wafers inspected by the inspection equipment (n-1) or review station (n-2); collecting the above defects distribution or defects variation data 31 per defect type, the fabrication process data 33 per wafer, sent from the fabrication history management unit 32, and the equipment data 35 that represents manufacturing conditions including the configuration and history of each manufacturing equipment, sent from the fabrication line management station 34; examining the collected defects distribution or defects variation data 31 per defect type for matching to what degree with a multiplicity of the past inspection results stored in the past fault database 39; and analyzing defects data, using the fabrication process data 33 per wafer and the equipment data 35 in combination.

The above-mentioned fabrication process data 33 per wafer is fabrication history data describing when a wafer was processed by what manufacturing equipment. The above-mentioned equipment data 35 describes units of wafers that the particular manufacturing equipment processes.

In order to implement the above-described processing method, the fabrication process data describing when a wafer was processed by what manufacturing equipment and the equipment data describing units of wafers that the particular manufacturing equipment processes are essential. Therefore, the inspection results collection and analysis unit 30 receives the defects data 31 per wafer from the inspection equipment or review station and infers what manufacturing sub-process and related manufacturing equipment caused the detected defects, using the defects data in combination with the fabrication process data 33 per wafer, sent from the fabrication history management unit 32, and the equipment data 35 representing the configuration and conditions of the equipment, sent from the fabrication line management station 34, as is shown in FIG. 13. By the analysis method according to the invention, once a faulty equipment has been determined, linked action of the control devices can stop the operation of that equipment and the fault monitoring unit 36 can give the alarm to the line administrator 37. Moreover, instructions to perform additional inspection of other wafers not yet inspected can be issued as required.

In the process of analysis, check is made for causal relationship of the structure of a manufacturing equipment and the number of wafers to be processed at a time by the equipment to the cycle in which defective wafers occur as shown in the example illustrated in FIG. 5. For this purpose, it is convenient to register in advance such information about each manufacturing equipment into a database like a table illustrated in FIG. 14 that is stored in a memory of the fabrication line management station 34. In the table shown in FIG. 14, the "process cycle" means the cycle in which wafers are processed under the same conditions.

For some manufacturing equipments, for example, the CVD equipment having two chambers and the CMP equipment having a plurality of heads, shown in FIG. 5C, the parts in use for process and the conditions differ, depending on the wafers to be loaded. For the process cycle of such equipments, specify the cycle in which wafers are processed by the same parts. For an equipment that processes a few lots of wafers at the same time, like the furnace shown in FIG. 5B, because the wafers are set in different positions in the furnace, specify the number of wafers to be processed at the same time as units of wafers. The "number of wafers to be processed at a time" in the table shown in FIG. 14 means the number of wafers that are normally processed sequentially at the same time or at a time. Because most equipments process one lot of wafers sequentially at a time, specify the number of wafers in one lot in the "number of wafers to be processed at a time" column. For an equipment like the furnace shown in FIG. 5B, if it processes, for example, 100 wafers at the same time, specify "100." As is illustrated in FIG. 14, it is preferable to record maintenance information for each manufacturing equipment also so that the source of defects can be inferred from the causal relationship between the maintenance and the occurrence of the defects. As is illustrated in FIG. 14, the table contains the entries of sub-process, manufacturing equipment name, process cycle, number of wafers to be processed at a time, and maintenance record which are used as the equipment data 35 for each manufacturing equipment.

Then, how the inspection results collection and analysis unit 30 evaluates the degree of matching in the step 62 mentioned in FIG. 6 will be explained in further detail. Varieties of defects actually occur to semiconductor wafers and matching of the distribution of detected defects with past similar defects distributions may not be well evaluated by simply comparing the defects distribution in a region and the past defects distributions in the corresponding region as illustrated in FIG. 9.

FIG. 15 shows examples of defects distributions such as pattern defects, particles, and scratches. In the defects distributions illustrated in FIGS. 15A, 15B, and 15C, high-density defects exist locally on the wafer. Especially, a narrow region in which a great number of defects exist together is generally called a cluster 151 as is shown in FIG. 15A.

In the defects distribution illustrated in FIG. 15C, a great number of defects disperse all over the wafer and this is thought to be scattered formation of the defects-dense region in FIG. 15B. The defects distributions illustrated in FIGS. 15D and 15E are examples that regular defects distributions exist within chips or shots besides the distribution over the wafer.

The defects distribution illustrated in FIG. 15D occur due to a fault of a pattern-forming mask such as a reticle error or a trouble with an exposure equipment. As compared defects caused by other manufacturing equipments, the dimensions of defects are smaller and defects occur in the corresponding position across the shots.

In another example of defects distribution as illustrated in FIG. 15E, a chip or shot has a defects-dense region in defects distribution within it and the distribution of the chips having such region within the chip (shot) takes a particular form over the wafer. This is due to that a portion of the wafer that is structurally susceptible to process variation is damaged, affected by an incorrect process that is evenly applied to the chips on the wafer. In such cases, even similar defects distributions having the same region where defects occur within the wafer, for example, the defects distribution illustrated in FIG. 15E (similar distributions exist within chips) and the defects distribution illustrated in FIG. 15 (defects randomly occur, independent of the chips) are considered as different modes and should be treated separately. In some defects distributions as in FIG. 15E, similar distributions exist within chips, but the defects distribution over the wafer do not have distinctive features.

As illustrated above, varieties of defects distributions occur, according to the cause of defects. For example, the cluster 151 shown in FIG. 15A where a local region on the wafer is affected and other distributions of defects that affect a broader area over the wafer are thought to be caused by different sources. Sometimes, it may happen that these defects occurrence modes coexist on one wafer. In order to properly infer a causal sub-process and related manufacturing equipment even for cases where defects of different modes coexist on the wafer, the above-described matching degree evaluation in the step S62 mentioned in FIG. 6 needs elaboration.

Then, an exemplary procedure of such evaluation for cases where different defects distributions coexist on the wafer, which is carried out by the inspection results collection and analysis unit 30, will be explained, using FIG. 16. Part or all of this evaluation procedure may be carried out by the inspection equipment or review station.

Figure 16:
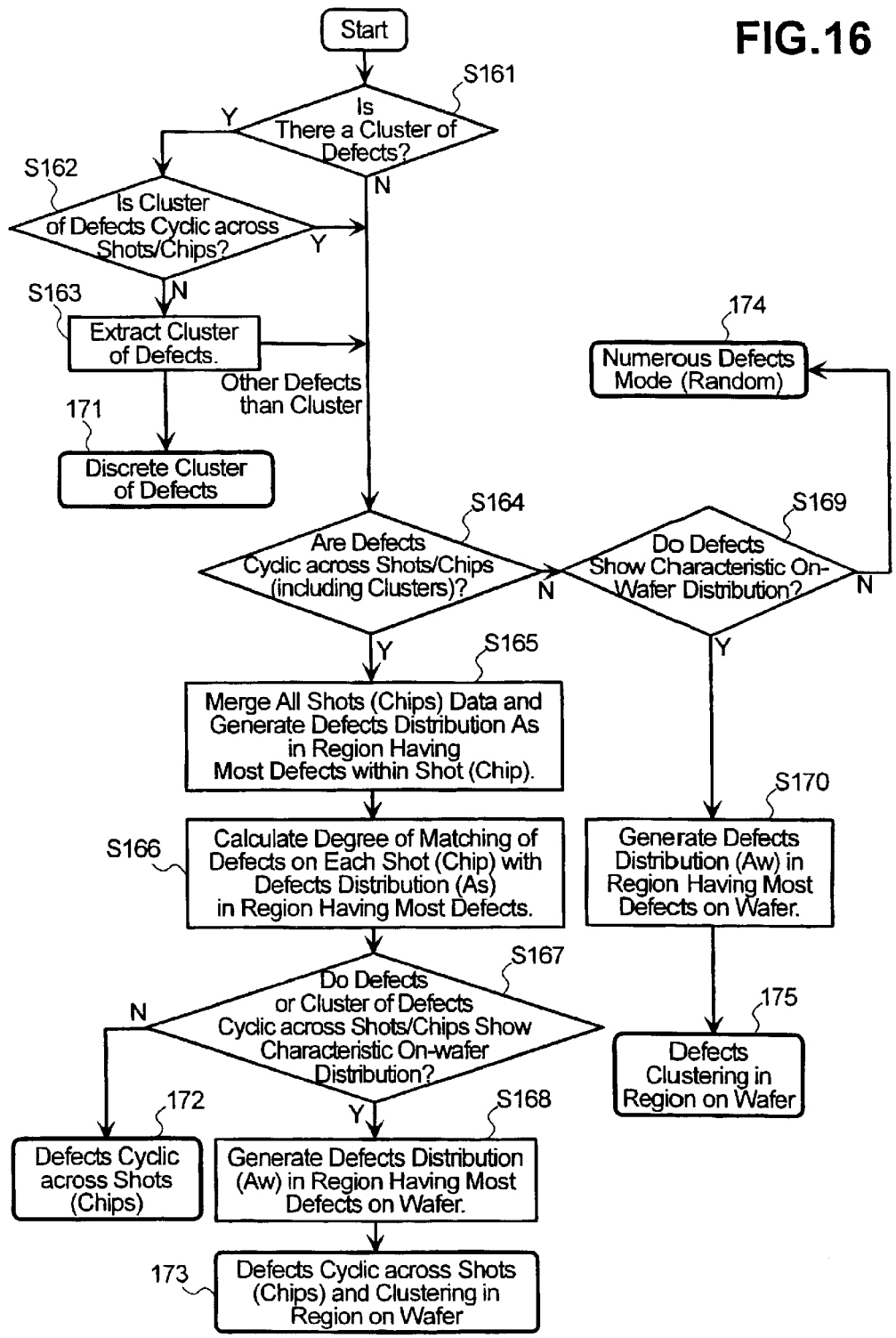
FIG. 16 is a flowchart of a procedure for evaluating defects distributions, according to the invention.

The inspection results collection and analysis unit 30 executes the steps according to the procedure illustrated in FIG. 16 so that defects distributions can be sorted as illustrated in FIG. 15. Because the cluster 151 is especially high-density defects, it is likely to make the analysis for other defects distributions difficult. Thus, in the first step S161, detect a cluster 151 of defects. Judging whether there is a cluster of defects should be done as follows. Measure the distance of two defects points (this point is the center of gravity of a defect or the like) for all defects. If defects for which the measure distance is shorter than a certain distance crowd together, the defects are regarded as a cluster. To facilitate this, a clustering method used in the conventional pattern recognition field can be applied.

If there is a cluster of defects by the judgment of step S161, judge whether the cluster of defects is cyclic across shots/chips in step S162. If the cluster of defects is not cyclic across shots/chips (the cluster of defects occurs discretely), extract the cluster of defects in step S163. Thus, a discrete cluster of defects S163 can be extracted.

In step S164, then analyze defects that fall under the cluster of defects judged cyclic across shots/chips in the step S162 and remaining defects distributions other than the discrete cluster of defects extracted in the step S163. That is, if similar clusters of defects occur across shots (in units of shots) or chips by judgment of the step S162, handle them as a defects distribution coming under the distribution pattern illustrated in FIG. 15(*e*) and examine how the defects occur over the wafer in the step S164.

In this way, in the steps S161 through S163, the cluster of defects that is not cyclic across chips or shots can be separated from other defects.

In the step S164, then check the remaining defects other than the clusters of defects to see whether the defects are cyclic across chips or shots. In the following, checking cyclic defects across chips will be explained; the same description applies to those across shots. In step S16, first merge all chips defects data and examine defects distributions within the chips in the same manner for defects distributions on the wafer illustrated in FIG. 9. For example, divide the chip area into small regions. If a region having especially high-density defects exists, evaluate the density of defects in the corresponding region within all chips. Examine whether the high-density defects region occurs within a particular chip or the similar region exists within a plurality of chips also. If the similar high-density defects state occurs to a plurality of chips, it is judged that the defects are cyclic across the chips. Evaluate other small regions in the same way. If another region has similarity to the region evaluated before, join these regions. Thereby, a defects distribution within a chip that is cyclic across chips (for example, defects distribution As in a region having most defects within the shot (chip)) can be obtained.

In step S166, compare each chip or shot with the thus obtained defects distribution within a chip or shot (for example, defects distribution As in a region having most defects within the shot (chip)) to determine the degree of matching in the same manner as for the defects distributions on the wafer illustrated in FIG. 9. Thereby, the defects distribution within a chip or shot and the distribution of the chips or shots having the above defects distribution within it can be obtained. Using these distributions, in step S167, examine whether defects or clusters of defects that are cyclic across chips (shots) show a characteristic on-wafer distribution. If there is a characteristic on-wafer distribution (defects occurring locally in a portion of the wafer such as bias), generate defects distribution Aw in a region having most defects on the wafer in step S168. Thereby, defects cyclic across shots (chips) and clustering in a region on the wafer 173 can be extracted. Unless there is a characteristic on-wafer distribution, defects cyclic across shots (chips) 172 can be extracted.

If the defects are not cyclic across chips or shots by judgement of the step S164, what to do is examining on-wafer defects distributions as illustrated in FIG. 9. That is, in step S169, examine whether the defects show a characteristic on-wafer distribution. If there is a characteristic on-wafer distribution, generate defects distribution Aw in a region having most defects on the wafer in step S170. Thereby, defects 175 clustering in a region on the wafer can be extracted. Unless there is a characteristic on-wafer distribution, defects in numerous defects mode (random) 174 can be extracted.

The defects distributions data obtained in the above-described manner should be recorded in storage 42 together with the results of inspection of wafers received from the inspection equipment or review station.

Figure 17:
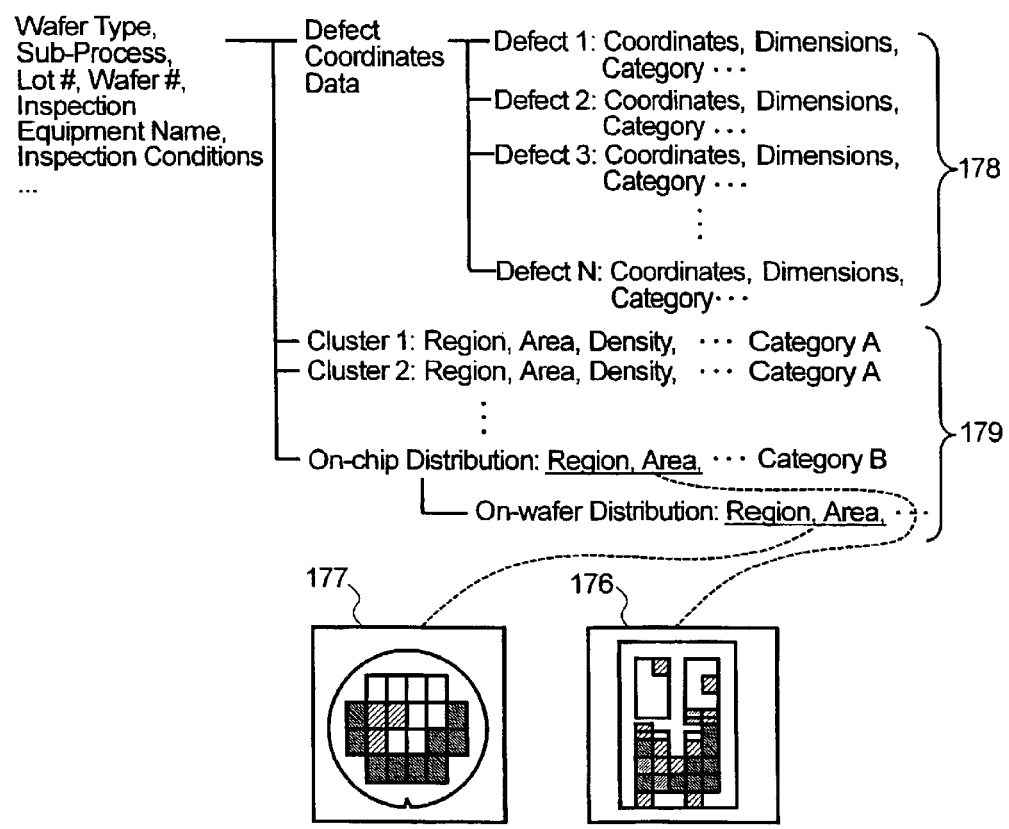
FIG. 17 illustrates an exemplary form of defects data stored, according to the invention.

FIG. 17 shows an exemplary data record (unit) to be stored in the storage 42, primarily consisting of defects data 178 and defects distributions data 179. The particulars of the exemplary data illustrated in FIG. 17 are as follows: wafer type, sub-process, lot number, wafer number, inspection equipment name, inspection conditions, etc. which are specified per data record (unit); defects data consisting of defect coordinates data (defect 1 to N: coordinates, dimensions, category, etc.) 178; a number of clusters (cluster 1, 2, . . . ) each consisting of region, area, density, . . . , category A (for example, particles); on-chip distribution of defects consisting of region, area, . . . , category B (for example, pattern defects) 176; and on-wafer distribution of defects consisting of region, area, etc. 177. Category data describing the type of defects is assigned to each cluster or defects distribution. A region may be defined by a set of the vertices of a polygonal or its visual image in tone gradation may be generated as illustrated in FIG. 17.

While general handling of defects distributions was described hereinbefore, it is desirable to separate reticle errors from other defects because the reticle errors, unlike other defects, occur in all shots of all wafers whenever they occur and cannot be removed until remedy action is taken. The reticle errors occur in all shots on a wafer and in the corresponding coordinates within the shots. Once a point at which the reticle error often occurs has been detected, the reticle errors are easy to recognize and should be removed before the start of the procedure illustrated in FIG. 16.

In the manner described hereinbefore, it is possible to roughly divide defects distributions on a wafer into clusters, on-chip or on-shot distributions, and on-wafer distributions, and obtain their shape and the density of defects within a region.

Based on the above-mentioned defects distributions data, by comparing the distribution of the detected defects with the defects distributions on the wafers inspected in the past and quantitatively evaluating the degree of matching (similarity), according to the steps S62 through S66 illustrated in FIG. 6, the inspection results collection and analysis unit 30 can determine the source of the defects. A plurality of defects distributions may take place on one wafer. In that event, analysis should be performed for each defects distribution. An advantage of the invention is that, by analyzing types of defects distributions in the above-described manner, investigating the cause of the detected defects can be performed certainly even if different types of defects resulting from different causes coexist on a wafer.

Some defects distributions result from the same cause, but do not occur in exactly the same position on the wafer. For example, if a manufacturing equipment is faulty, causing defects in the lower left portion of the wafer, a great number of defects would occur near the lower left rim of the wafer as is illustrated in FIGS. 18A and 18B. In this case, there is a possibility that the defects appear in somewhat different positions as shown in FIGS. 18A and 18B, though they result from the same cause. By contrast, defects that occur in the center of the wafer as is illustrated in FIG. 18C are thought to be result from another cause. Thus, when evaluating the degree of matching (similarity) between defects distributions, it is desirable to evaluate the same forms of defects distributions high in matching (similarity) even if occurring in somewhat different positions.

In some embodiment, it may be preferable that the inspection results collection and analysis unit 30 calculates the degree of matching (similarity) between defects distributions in the corresponding position as well as those displaced therefrom. Use a distance function as a weight function (factor). A greater value of the distance function is assigned to a region of defects that is nearer to the position where the highest degree of matching between defects distributions is evaluated. For a region, after determining a degree of matching (similarity) between defects distributions, multiple the degree by its weight function (factor). Thus, final evaluation of matching (similarity) between defects distributions in a region should be performed.

For example, let us to determine which of the regional distribution shown in FIG. 18B and that shown in FIG. 18C has a higher degree of matching (similarity) to the distribution shown in FIG. 17A. Multiply the obtained matching degree for each distribution by the weight function (factor) that decreases as the distance from the reference position increases. Because the distribution of FIG. 18B is nearer to the distribution of FIG. 18A than the distribution of FIG. 18C, its matching degree is multiplied by a greater weight function (factor). Hence, evaluation is that the distribution of FIG. 18B has a higher degree of matching (similarity) than the distribution of FIG. 18C. For on-shot or on-chip defects distributions, matching should be evaluated by alignment on a X-Y plain. For on-wafer defects distributions, matching should be evaluated by matching in the radius direction and the rotational direction in angles because wafers are circular. Usually, locally occurring defects, for example, scratches due to a fault of the loader, often result from a cause in the vicinity of the location of the defects and they generally appear in the corresponding position on all chips or wafers; in short, they have comparatively high repeatability. By contrast, defects resulting from an indirect cause, for example, particles from the source thereof at a distance from the place where wafers are processed, affect a wider area and, generally, do not appear in the corresponding position on all chips or wafers; in short, they have low repeatability. Reticle errors are thought to appear in the corresponding position on all chips and are detected in position as accurately as the precision of the coordinates for defect detection of the inspection equipment.

In general, appearance of defects distributions in the corresponding position on all chips or wafers, in short, the repeatability of defects, depends on the extent of the region where the defects occur. In view hereof, an extent factor should be added to the above-mentioned weight function (factor) that changes the value of degree of matching (similarity), according to the position of the region of defects. For example, project defects on suitable coordinate axes and measure the length of a region of the projected defects. According to the projected defects region length, the function (factor) should be assigned so that the weight greatly decreases when the distance of the defects distribution from the reference position is longer and the projected defects region length is shorter.

As the coordinate axes, those representing the radius and circumferential directions should be used for on-wafer distributions as described above. In the case of FIG. 18, the distribution of FIG. 18A extends in the circumferential direction. In view hereof, the weight function (factor) should be set so that the matching degree does not decrease if displacement in the circumferential direction is greater than displacement in the radius direction.

In the embodiment described hereinbefore, the analysis method was discussed, assuming that sufficient inspection results are available. However, for a fabrication line for a production mode that accommodates a variety of wafer products and a small quantity of each type products, it may be difficult to obtain a sufficient amount of data for same type products. In such cases, analysis should be performed, using data for different types of wafers in combination. If the conditions of inspection (defect detection sensitivity) differ, depending on the type of wafers to be evaluated, evaluation should be performed in the following manner. Set referential inspection sensitivity in advance; inspect the same wafers by the referential inspection conditions and ordinary inspection conditions; and obtain a ratio of the defect count under ordinary conditions to the defect count obtained under the referential conditions. Using this ratio as an inspection sensitivity correction coefficient, convert the number of detected defects into the defect count that is obtained under the reference conditions. For on-shot or on-chip defects distributions, comparison is impossible between different types of wafers. If a variety of wafers are inspected, comparison is made between on-wafer defects distributions without regard to on-shot or on-chip distributions.

The procedure illustrated in FIG. 6 assumed that a causal equipment is sought from among all sub-processes prior to the inspection process. For a detected wafer on which a great number of defects occurred, if a wafer having similar distribution of a great number of defects is not found in the inspection processes prior to the sub-process where the defective wafer was found, a sub-process that caused the defects is likely to fall between the inspection process where the defective wafer was first found and the preceding inspection process, that is, the last sub-process where no defective wafers were found.

In this case, the inspection results collection and analysis unit 30 first performs analysis for the manufacturing equipments existing between the inspection process where the defective wafer was first found and the preceding inspection process, using equipment data 35, fabrication process history data 33, and the like. Thereby, analysis can be carried out with a relatively small amount of calculation. If, however, a causal sub-process failed to be identified, additional evaluation is performed, using the data for the sub-processes prior to the examined stage. This is because a faulty sub-process causing defects and a sub-process where the defects actually occur due to the faulty process are not always identical. For example, a deposition sub-process involves a fault and, in a later heat treatment sub-process, defects occur to only wafers processed by the faulty deposition process.

Using the results of analysis of defects for finding out the cause of the defects through the data processing performed by the inspection results collection and analysis unit 30 according to the invention, a method of managing the fabrication process will then be described. As illustrated in the above-described embodiment, the method of the invention can ascertain what caused defects. However, some source of defects is likely to cause similar defects to recur.

Figure 19:
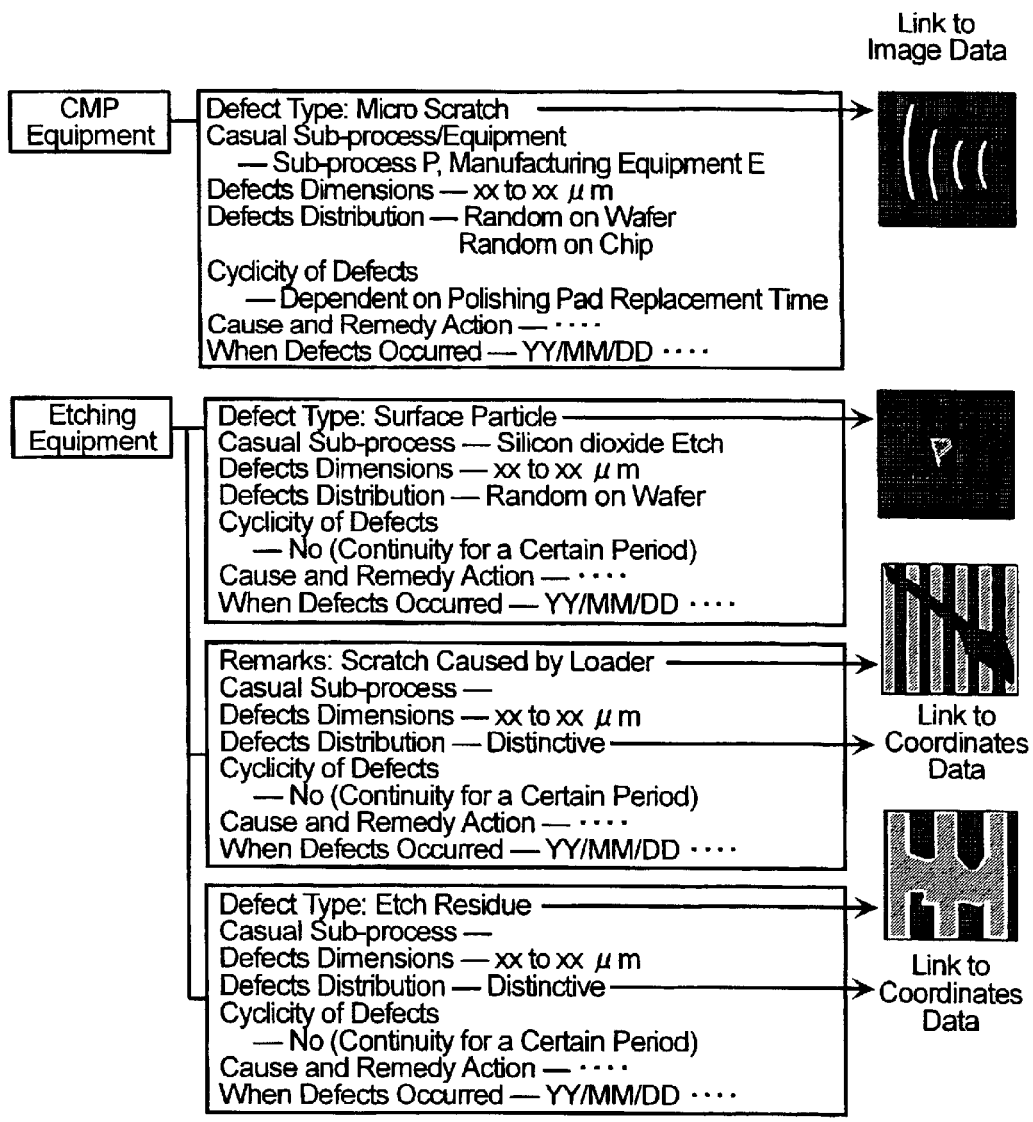
FIG. 19 illustrates an exemplary database of defect instances, according to the invention.

In view hereof, the inspection results collection and analysis unit 30 is able to retrieve the occurrence states of defects in the same mode of the once isolated cause of defects from the database and output to the display device 40, display and annunciator means 38, and fabrication line management station 34. Monitoring this information, the operator or administrator can take measures and prevent similar defects recurrence. The inspection results collection and analysis unit 30 stores instances of defects obtained through analysis, which are illustrated in FIG. 19 (regarding CMP and etching equipments), as a database, in its storage 42. As defect instances data, defect type, causal wafer sub-process and equipment, features of defects such as dimensions and distribution, cyclicity of defects, day/time when defects occurred in the past, etc. are stored. If the cause was isolated and revealed, the cause and remedy method should be stored with the above-mentioned data so that the operator or administrator can quickly cope with similar defects if recur in future.

Among the defects occurred in the past, the inspection results collection and analysis unit 30 registers in advance, particularly, defects that are anticipated to recur as recurrence mode defects into the storage 42 so it can monitor the recurrence mode defects and give the alarm to the line administrator via the fault monitoring unit 36 and the display and annunciator means 38 when the occurrence of similar defects of similar distributions is detected. Once recurrence mode defects have been registered, the inspection results collection and analysis unit 30 can detect defects of similar mode and prevent frequent occurrence of defects of this mode. Occurrence of similar defects distributions should be detected in the following manner. Set a threshold, based on the matching degrees for the manufacturing equipments in which no trouble has occurred. If the matching degree of similar defects exceeds the threshold, give the alarm to the administrator. In this way, the inspection results collection and analysis unit 30 monitors the recurrence mode defects registered beforehand. Thereby, a constantly stable fabrication process can be realized and a constant good yield can be expected. Remedy actions that have previously been taken against such defects should be registered with the defects so that the operator or administrator can quickly cope with the defects if recur. The downtime of a causal manufacturing equipment can be minimized.

While the system configuration according to a preferred embodiment of the invention shown in FIG. 3 is an example of a whole fabrication line including inspection equipment, the functions of analyzing defects distributions and cyclicity may be installed in a standalone inspection equipment. The standalone inspection equipment is capable of cyclicity analysis for defects occurred to wafers in lots and outputs photographs of defects with defects distributions marked thereon, graphs of matching degree data, cyclicity analysis results to the display device connected to it so that personnel who has knowledge of the characteristics or properties of the manufacturing equipments can infer a causal manufacturing equipment. In some embodiment, it may be possible to register data of the process units of all manufacturing equipments on the inspection equipment and provide the inspection equipment with a function of presenting manufacturing equipments as likely sources of defects that have a process cycle corresponding to the cycle as the analysis result. In this way, by providing the inspection equipment with the analysis function, analysis results can be obtained immediately after inspection. In other words, the inspection equipment may be furnished with the inspection results collection and analysis unit 30.

Furthermore, it is preferable to store device layout data into the storage 42 beforehand so that the inspection results collection and analysis unit 30 can investigate the cause of defects more easily by using defects distributions and device layout data in combination.

Figure 20:
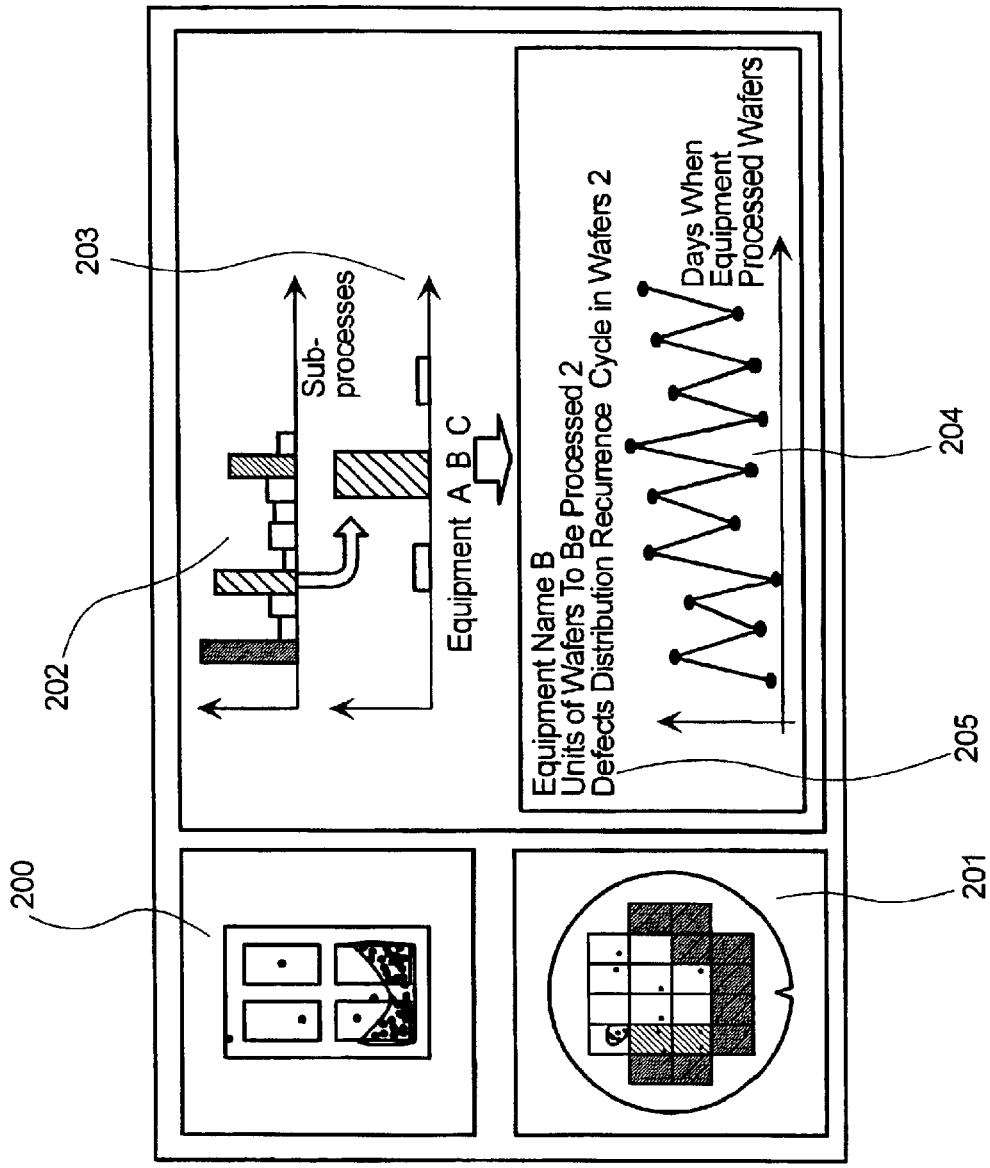
FIG. 20 illustrates an example of presentation of analysis results, according to the invention.

The inspection results collection and analysis unit 30 displays defects distributions on the display device 40, for example, a defects distribution 200 which is shown in FIG. 20, where a defects distribution obtained is superposed on actual layout of on-chip (on-shot) patterns. This enables the operator to know which portion of the layout of patterns is susceptible to defects and may help perform in-depth analysis for finding out the source of the defects. To display layout data with defects distributions, means for getting design data are necessary. In some embodiment, it is desirable to configure the inspection results collection and analysis unit 30 so that it can get design data from a design data server.

The inspection results collection and analysis unit 30 displays not only an on-chip defects distribution 200, but also an on-wafer defects distribution to make the defects easy to locate. It is preferable to change the colors of the chips on the wafer, according to the degree of matching with the on-chip defects distribution 200, so that the operator can easily and visually distinguish a portion of the wafer where the defects have on-chip defects distributions from the remaining portion where defects are distributed. If a plurality of different defects distributions coexist on a wafer, it is preferable to show them in different colors and shapes on the display device 40 and present analysis results of one of the distributions selected by the operator.

The inspection results collection and analysis unit 30 also displays processes as likely sources of defects obtained by analysis in a list of evaluation values 202 on the display device 40 so that the operator can know which processes have especially high evaluation values. It is preferable to enable the operator to select one of the processes and check a list of matching (similarity) 203 degrees of the equipments used in that process. The inspection results collection and analysis unit 30 displays a graph of matching (similarity) degree data sequence 204 for the sub-process and related manufacturing equipment selected by the operator, together with related data including the equipment name that processed the wafers, a cycle of defects occurrence obtained from the analysis results, a cycle of process judged corresponding to the cycle of defects occurrence, and date/time or cycle of maintenance, so that the operator can easily judge validity of the analysis results.

The method of investigating the cause of defects according to the invention can be applied equally to, in addition to semiconductor wafer products, products that are manufactured through a plurality of processes, for example, display devices such as TFT and plasma display and magnetic heads for use in magnetic recording devices.

Even for cases where there are less inspection processes than in the semiconductor manufacturing process, for example, a factory where only complete product inspection is performed before shipment, from the history of equipment that processed defective products, it is possible to pinpoint a sub-process and related manufacturing equipment in the same way as described hereinbefore with the preferred embodiment.

According to the invention, using the defect inspection results, a manufacturing equipment that causes abnormal defects can be determined quickly and easily. The benefit hereof is preventing the production line from outputting a great amount of unacceptable products due to a manufacturing equipment fault.

Furthermore, advantage of the invention is process variation management that can prevent the production line from frequently outputting unacceptable products due to a manufacturing equipment fault.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method for manufacturing semiconductor devices comprising:
    an inspection step of inspecting semiconductor substrates processed until a predetermined sub-process for defects or suspected defects occurred to the semiconductor substrates, with an inspection equipment, in a fabrication line consisting of a plurality of sub-processes arranged in sequence, each sub-process being performed by one or a plurality of manufacturing equipments; and
    a step of collecting and analyzing inspection results,
    wherein said step of collecting and analyzing inspection results comprising:
        a step of generating a defects distribution on a semiconductor substrate in order to investigate the cause of the defects, based on the inspection results obtained from said inspection step;
        a step of quantitatively evaluating defect features of the defects distribution on a semiconductor substrate generated by said step of generating a defects distribution;
        a step of generating data of the defect features quantitatively evaluated by said step of quantitatively evaluating defect features for the manufacturing equipments that processed the semiconductor substrates and the sub-processes that applied to the semiconductor substrates; and
        a causation inferring step of evaluating cyclicity of the defect features data for the manufacturing equipments that processed the semiconductor substrates and the sub-processes that applied to the semiconductor substrates generated by said atop of generating data, thereby inferring a causal manufacturing equipment that caused the defects.

2. A method for manufacturing semiconductor devices according to claim 1, further comprising a step of taking remedy action for the causal manufacturing equipment or sub-process that caused the defects, inferred by said causation inferring step in said step of collecting and analyzing inspection results.

3. A method for manufacturing semiconductor devices according to claim 1, wherein said step of generating a defects distribution in said step of collecting and analyzing inspection results includes a step of specifying in advance a defects distribution on a semiconductor substrate.

4. A method for manufacturing semiconductor devices according to claim 1, wherein said step of generating a defects distribution in said step of collecting and analyzing inspection results includes a step of specifying in advance a defect type and a defects distribution on a semiconductor substrate.

5. A method for manufacturing semiconductor devices according to claim 1, wherein said causation inferring step in said step of collecting and analyzing inspection includes a step of identifying a manufacturing equipment whose cycle of processing semiconductor substrates nearly corresponds to said cyclicity of the defect features data.

6. A method for manufacturing semiconductor devices comprising:
    an inspection step of inspecting semiconductor substrates processed until a predetermined sub-process for defects or suspected defects occurred to the semiconductor substrates processed until a predetermined sub-process for defects or suspected defects occurred to the semiconductor substrates, with an inspection equipment, in a fabrication line consisting of a plurality of sub-processes arranged in sequence, each sub-process being performed by one or a plurality of manufacturing equipments; and
    a step of collecting and analyzing inspection results,
    wherein said step of collecting and analyzing inspection results comprising:
        a step of generating a defects distribution on a semiconductor substrate in order to investigate the cause of the defects, based on the inspection results obtained from said inspection step;
        a step of quantitatively evaluating defect features of the defects distribution on a semiconductor substrate generated by laid step of generating a defects distribution;
        a step of generating data of the defect features quantitatively evaluated by said step of quantitatively evaluating defect features for the manufacturing equipments that processed the semiconductor substrates and the sub-processes that applied to the semiconductor substrates; and
        a causation inferring step of evaluating correlations between said defect features and said manufacturing equipments that processed the semiconductor substrates for each sub-process that applied to the semiconductor substrates, based on the defect features data for the manufacturing equipments that processed the semiconductor substrates and the sub-processes that applied to the semiconductor substrates, generated by said step of generating data, and selecting a sub-process of high correlation, thereby inferring a causal manufacturing equipment that caused the defects.

7. A method for manufacturing semiconductor devices according to claim 6, further comprising a step of taking remedy action for the causal manufacturing equipment or sub-process that caused the defects, inferred by said causation inferring step in said step of collecting and analyzing inspection results.

8. A method for manufacturing semiconductor devices according to claim 6, wherein said step of generating a defects distribution in said step of collecting and analyzing inspection results includes a step of specifying in advance a defects distribution on a semiconductor substrate.

9. A method for manufacturing semiconductor devices according to claim 6, wherein said step of generating a defects distribution in said step of collecting and analyzing inspection results includes a step of specifying in advance a defect type and a defects distribution on a semiconductor substrate.

10. A method for manufacturing semiconductor devices according to claim 6, wherein said step of quantitatively evaluating defect features in said step of collecting and analyzing inspection results includes a step of evaluating similarity of the defects distribution on a semiconductor substrate generated by said step of generating a defects distribution to defects distributions respectively observed on a plurality of semiconductor substrates inspected in the past.

11. A method for manufacturing semiconductor devices according to claim 6, wherein, in said step of evaluating similarity, the similarity is evaluated with regard to defects distributions of nearly the same defect type.

12. A method for manufacturing semiconductor devices according to claim 6, wherein said causation inferring step in said step of collecting and analyzing inspection includes a step of identifying a manufacturing equipment whose cycle of processing semiconductor substrates nearly corresponds to said cyclicity of the defect features data.

* * * * *